United States Patent [19]

Nihira et al.

[11] Patent Number: 5,244,822
[45] Date of Patent: * Sep. 14, 1993

[54] METHOD OF FABRICATING BIPOLAR TRANSISTOR USING SELF-ALIGNED POLYSILICON TECHNOLOGY

[75] Inventors: Hiroyuki Nihira, Ayase; Nobuyuki Itoh, Tokyo; Hiroomi Nakajima, Yokohama; Eiryo Tsukioka, Tokorozawa; Toshio Yamaguchi, Tokyo, all of Japan

[73] Assignee: Kabushiki Kaisha Toshiba, Kawasaki, Japan

[*] Notice: The portion of the term of this patent subsequent to Mar. 13, 2007 has been disclaimed.

[21] Appl. No.: 818,275

[22] Filed: Jan. 8, 1992

Related U.S. Application Data

[63] Continuation of Ser. No. 350,860, May 9, 1989, Pat. No. 5,096,842.

[30] Foreign Application Priority Data

| May 16, 1988 | [JP] | Japan | 63-118458 |
| Jul. 11, 1988 | [JP] | Japan | 63-172302 |
| Aug. 23, 1988 | [JP] | Japan | 63-207446 |

[51] Int. Cl.$^5$ ............................................. H01L 21/265
[52] U.S. Cl. ............................ 437/31; 437/162; 437/228; 437/909; 148/DIG. 11
[58] Field of Search ............... 437/31, 162, 33, 909, 437/228; 148/DIG. 11

[56] References Cited

U.S. PATENT DOCUMENTS

| 4,229,502 | 10/1980 | Wu et al. | 437/81 |
| 4,531,282 | 7/1985 | Sakai et al. | 437/80 |
| 4,663,827 | 5/1987 | Nakahara | 437/41 |
| 4,693,782 | 9/1987 | Kikuchi et al. | 437/31 |
| 4,746,629 | 5/1988 | Hanagasaki | 437/162 |
| 4,830,972 | 5/1989 | Hamasaki | 437/31 |
| 4,908,324 | 3/1990 | Nihira et al. | 437/31 |

FOREIGN PATENT DOCUMENTS 225672 6/1987 European Pat. Off. .
3825701 2/1989 Fed. Rep. of Germany .

OTHER PUBLICATIONS

Orvek et al., "Carbonized layer formation in ion implanted photoresist masks", Nuclear Instruments & Method in Physics Research, 1985, pp. 501-506.
JP 61-237 467 A: In Patents Abstracts of Japan, 1987, vol. 11, No. 83, E-489.
IEEE Transactions on Electron Devices, 1984, vol. ED-31, No. 12, pp. 1781 to 1783.
Proceedings of the 12th Conference on Solid State Devices, Tokyo; Tsutomu Fujita et al.; 1980, pp. 149-153.
Proceedings of the BCTM; B-Y Hwang et al.; 1987, pp. 176-179.

Primary Examiner—Brian E. Hearn
Assistant Examiner—Tuan Nguyen
Attorney, Agent, or Firm—Oblon, Spivak, McClelland, Maier & Neustadt

[57] ABSTRACT

In a bipolar transistor, having a micronized structure for a high-speed LSI, which is fabricated by a self-alignment technology, a barrier insulating film is buried in a portion around an emitter layer so as to be deeper than a junction level between an active base layer and a collector layer. When a polysilicon film pattern which defines an active base region and serves as a portion of a base electrode is formed on a wafer surface, a surface portion of a photoresist serving as an etching mask is converted to a carbonized layer by ion implantation. When a micronized emitter layer is formed by a polysilicon-emitter technology, ion implantation is performed before deposition of the polysilicon film or an impurity is doped in the polysilicon film simultaneously with deposition, and rapid thermal annealing is performed so as to activate the doped impurity.

12 Claims, 21 Drawing Sheets

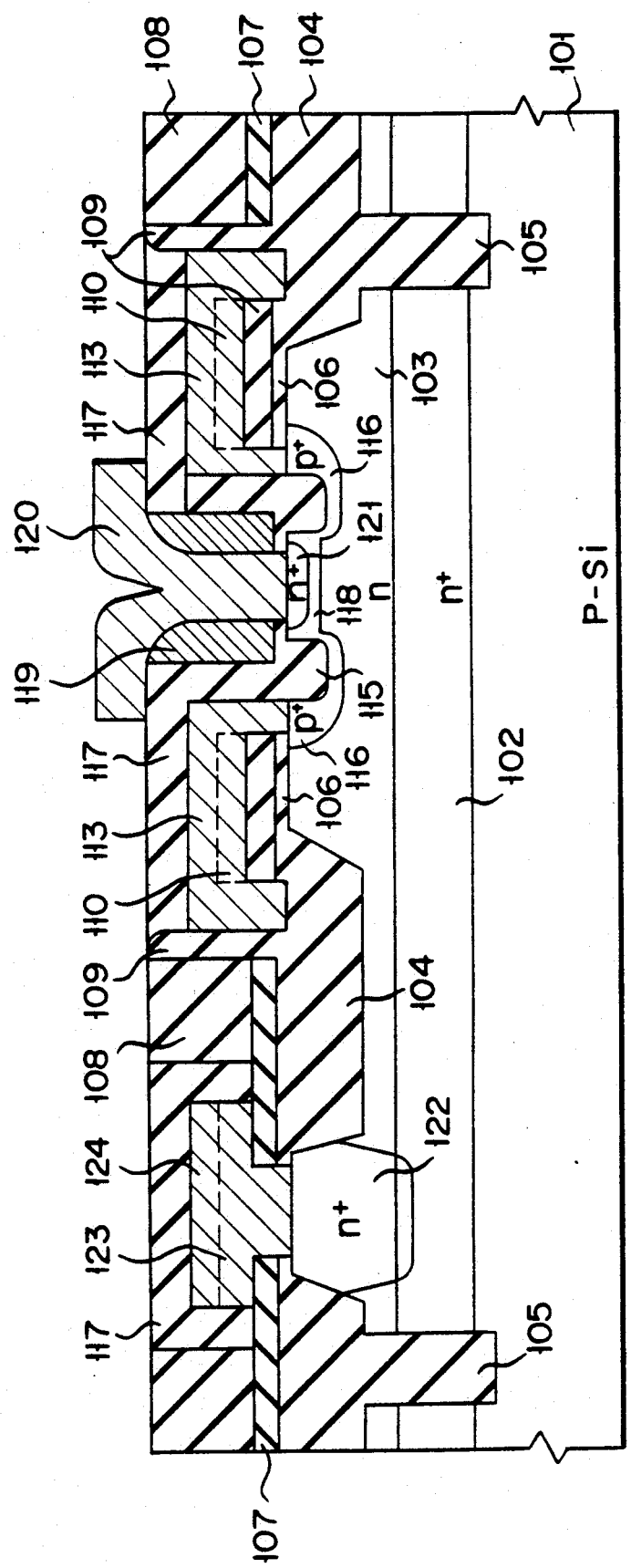
F I G. 1

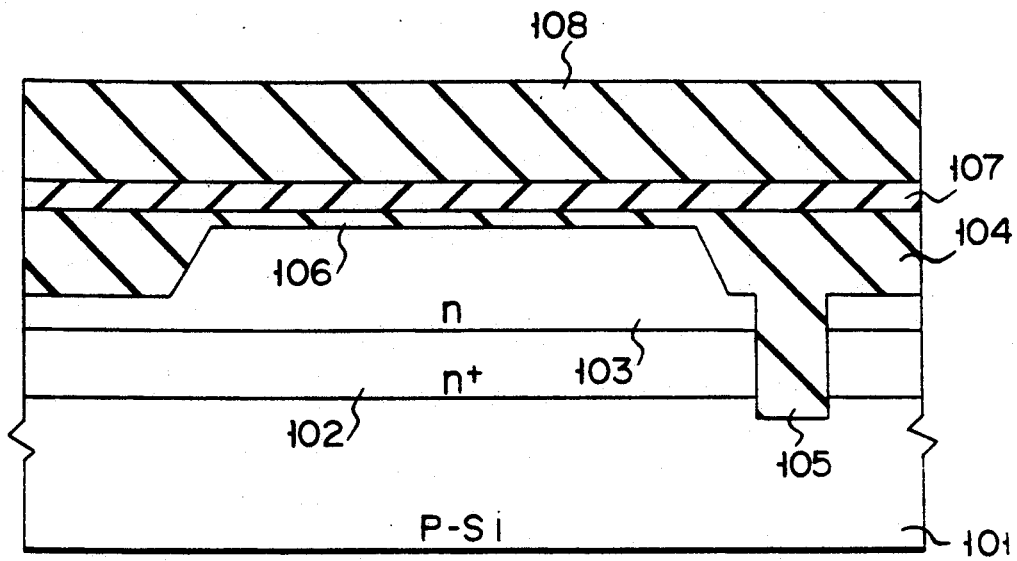
F I G. 2A
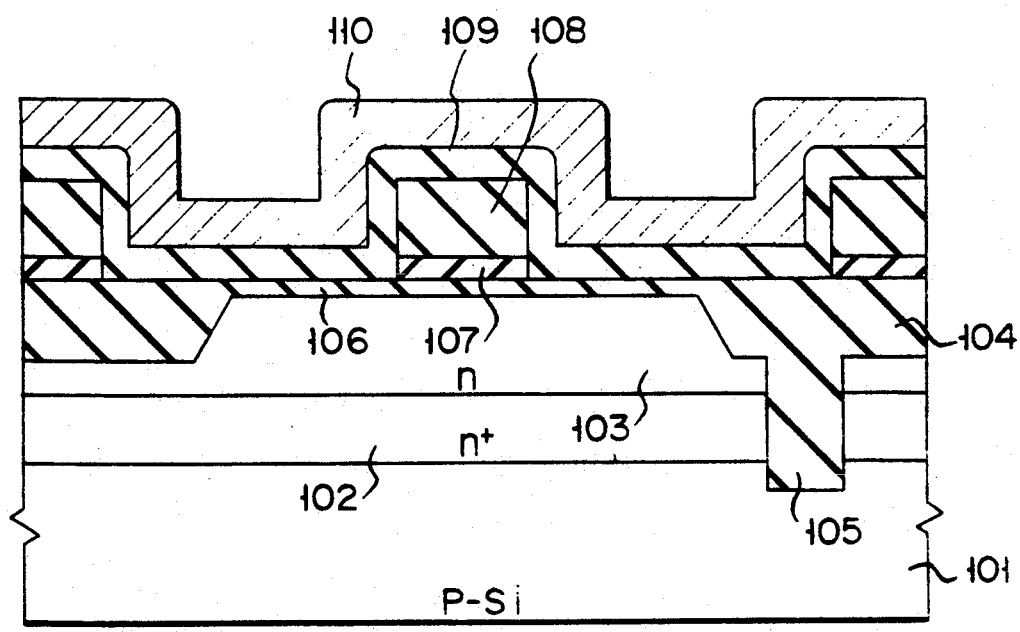
F I G. 2B

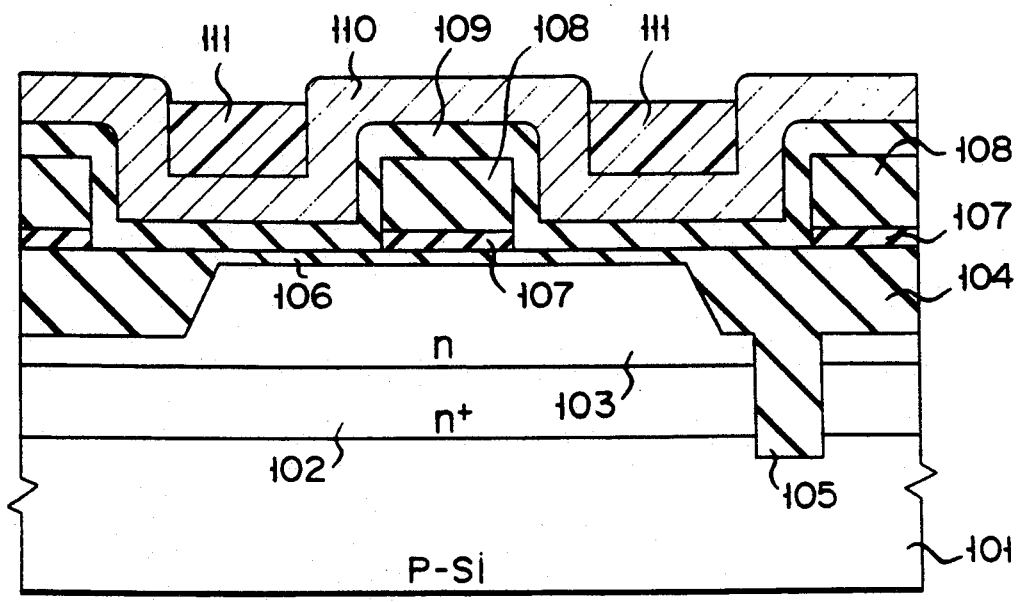
F I G. 2C
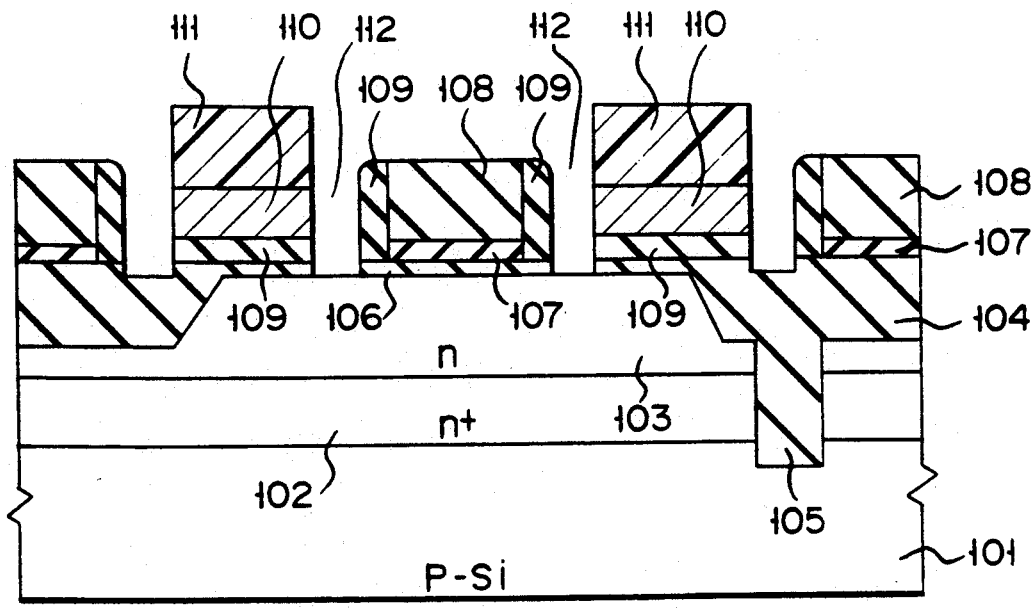
F I G. 2D

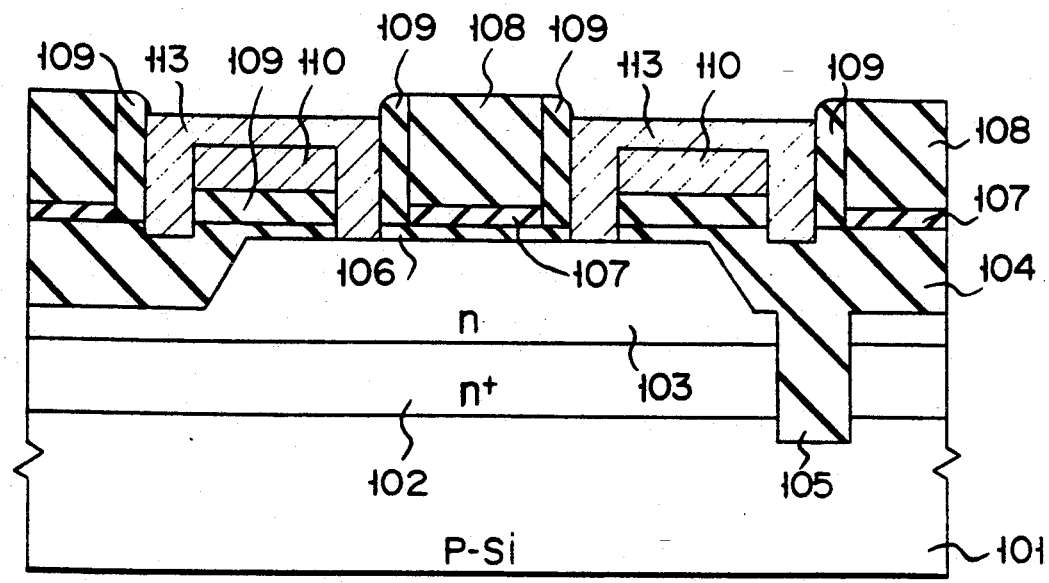
F I G. 2E
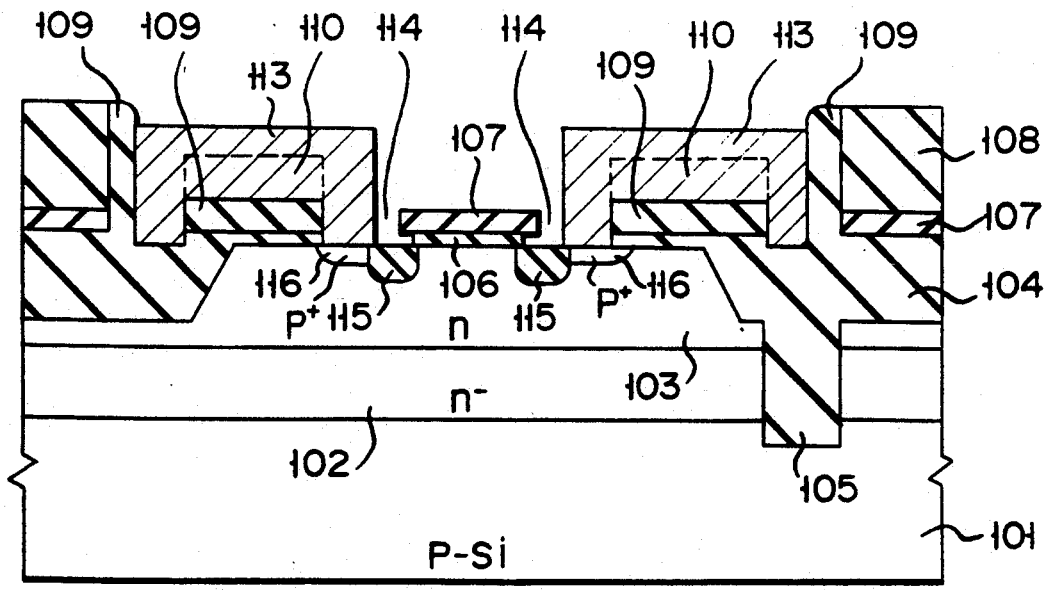
F I G. 2F

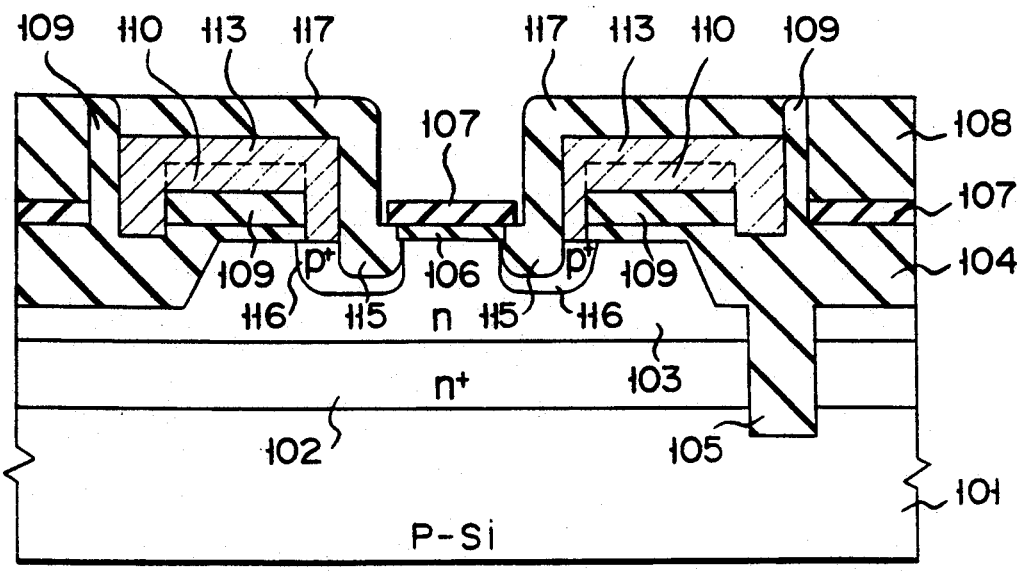
F I G. 2G
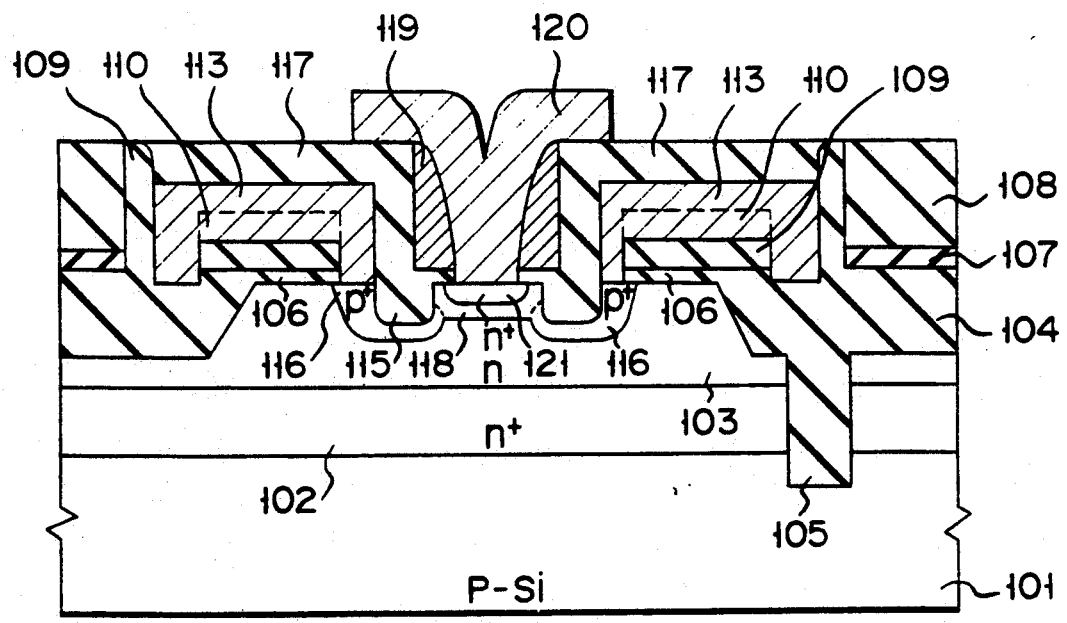
F I G. 2H

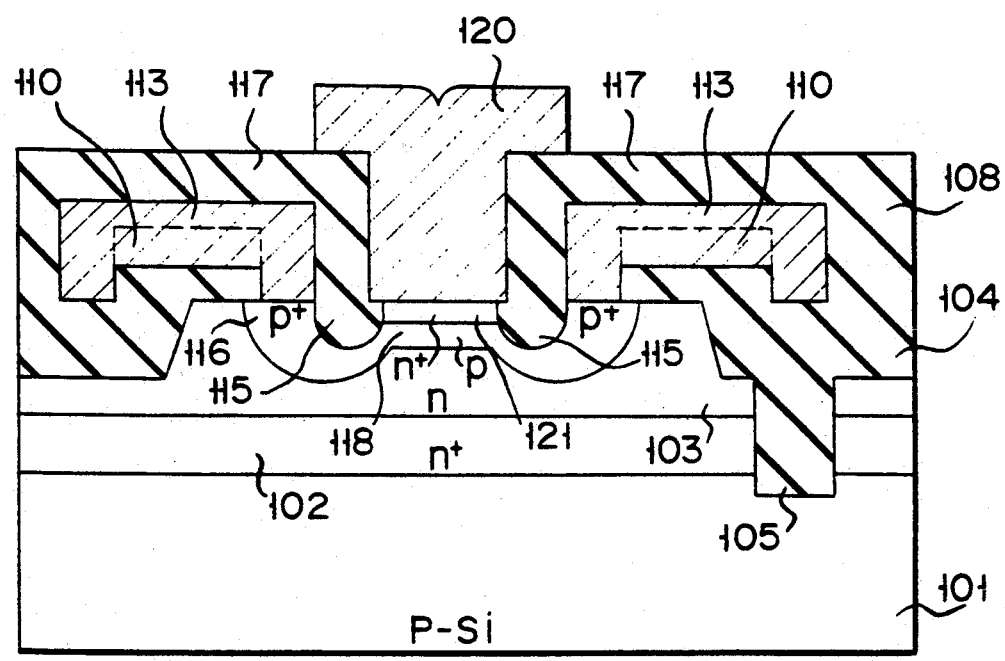
F I G. 3

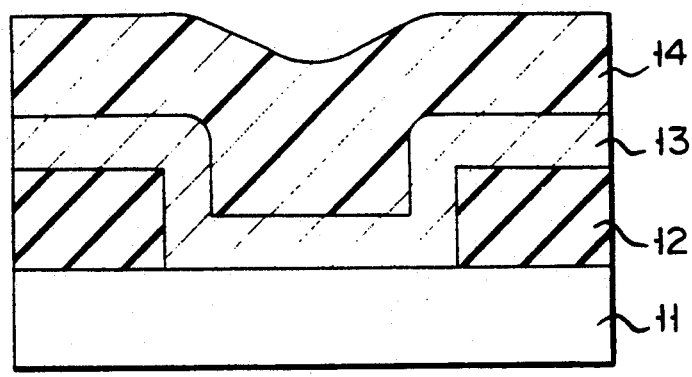
F I G. 4A
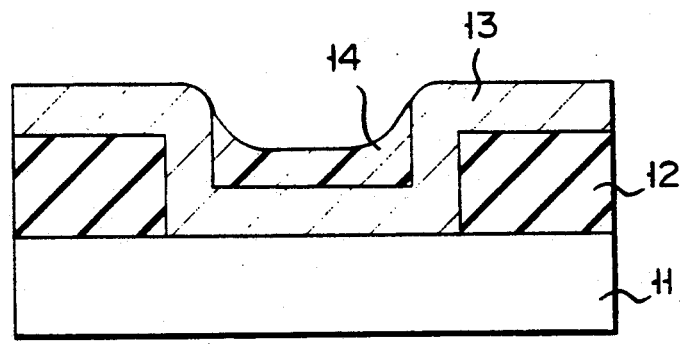
F I G. 4B
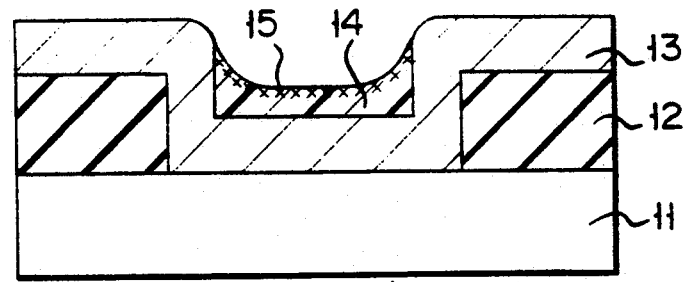
F I G. 4C
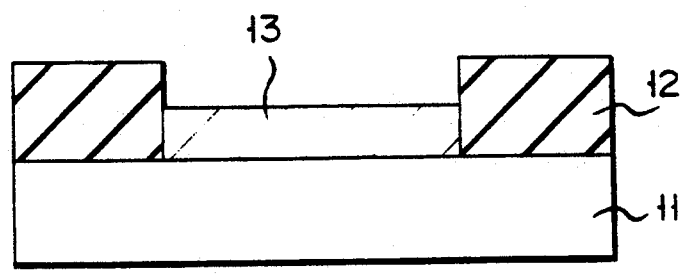
F I G. 4D

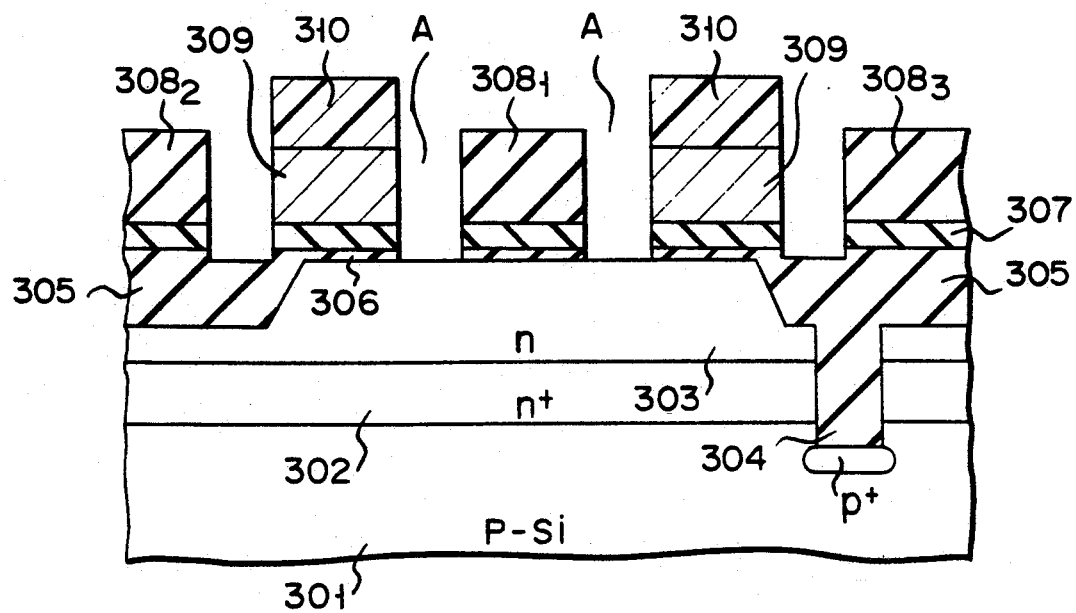
F I G. 7C
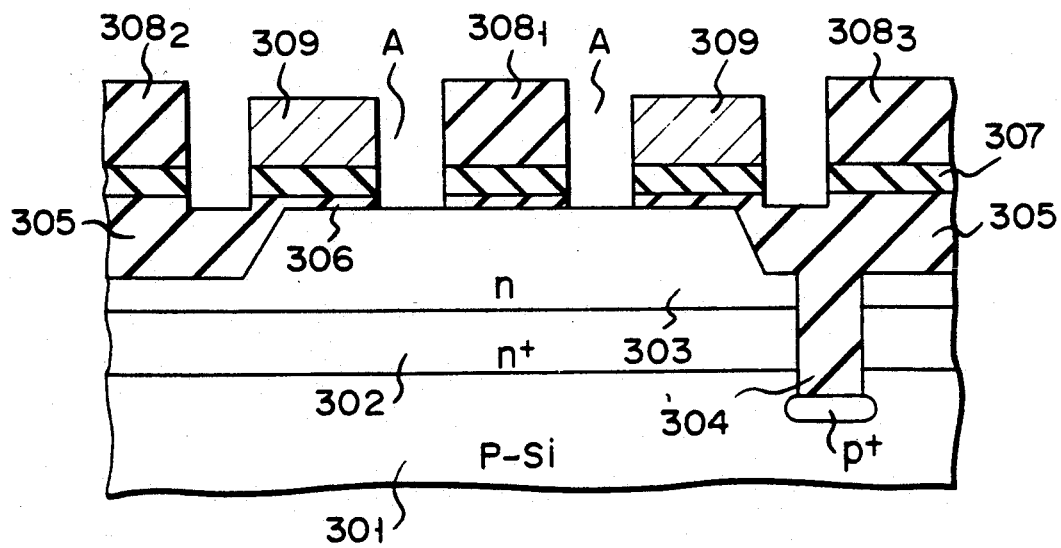
F I G. 7D

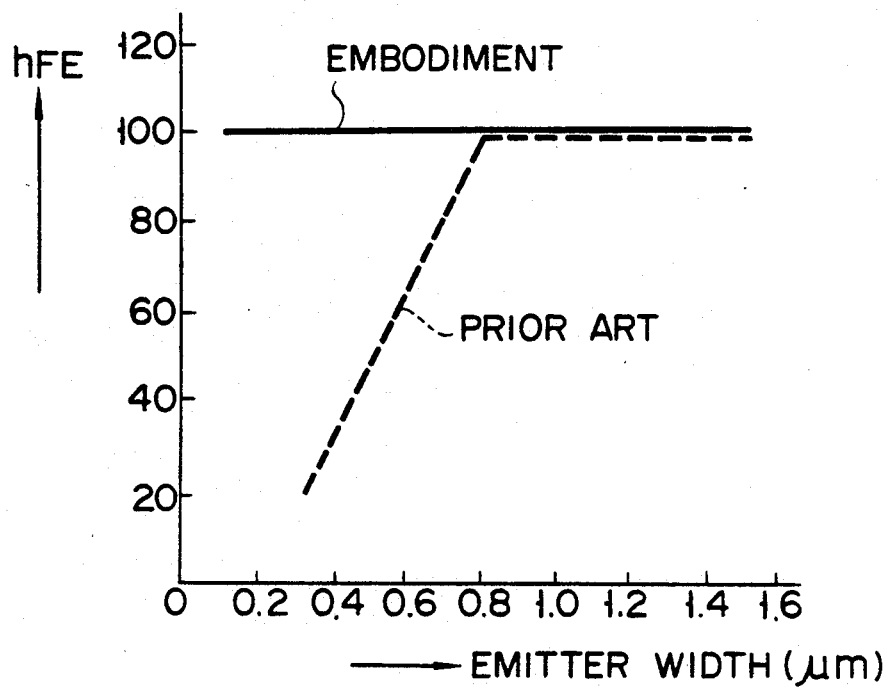
F I G. 8
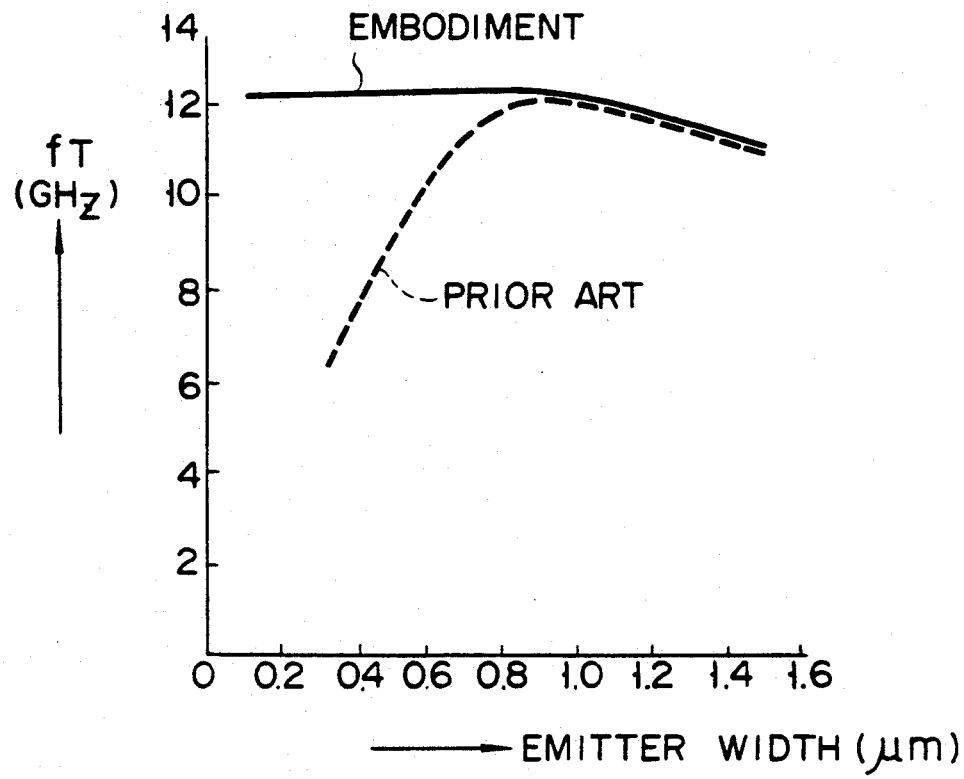
F I G. 9

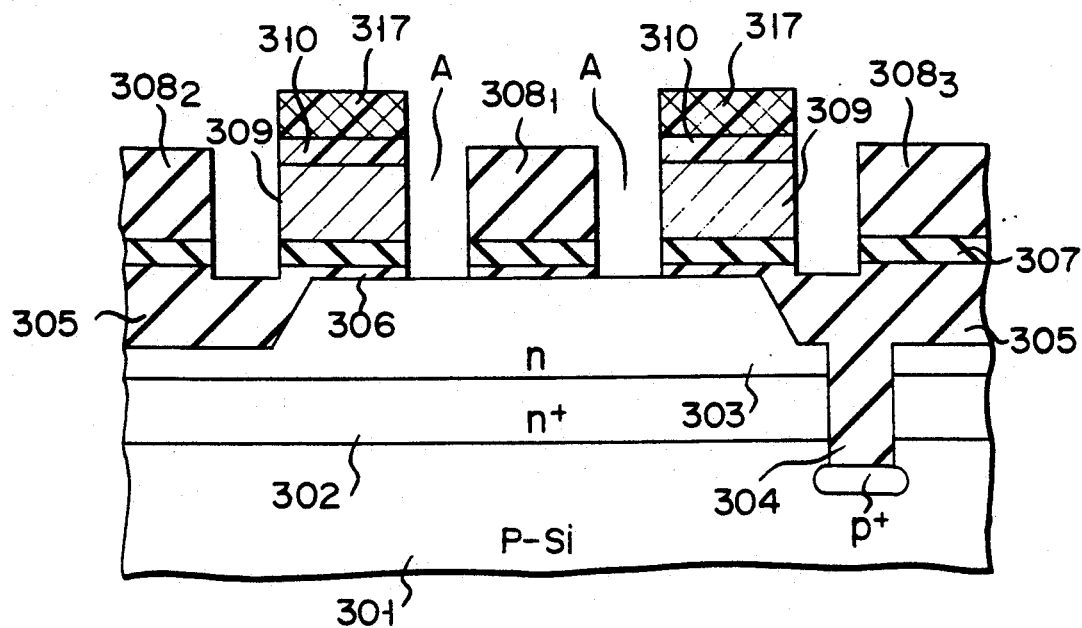
F I G. 10C
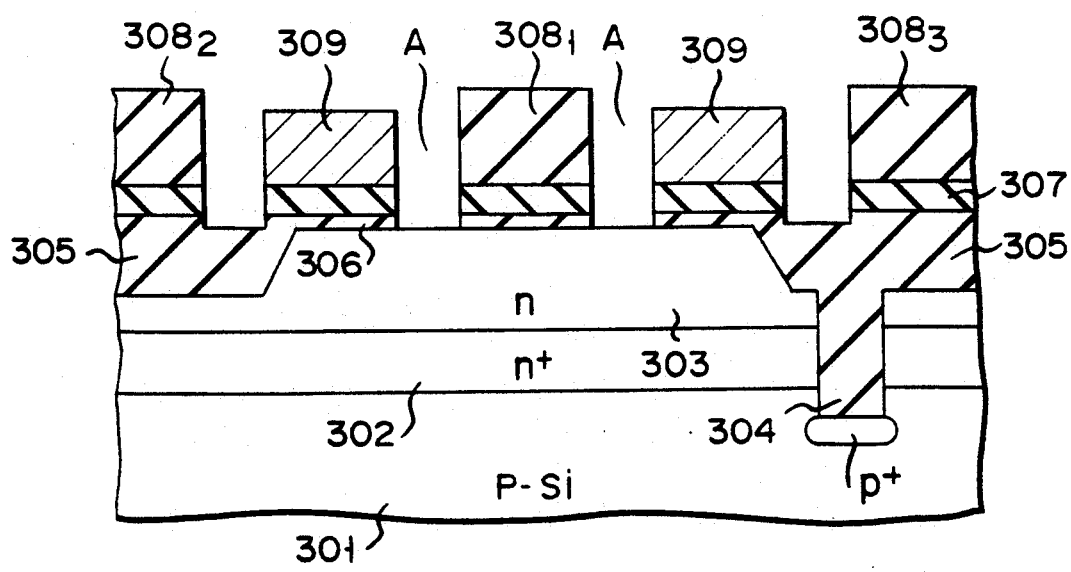
F I G. 10D

METHOD OF FABRICATING BIPOLAR TRANSISTOR USING SELF-ALIGNED POLYSILICON TECHNOLOGY

This is a continuation of application Ser. No. 07/350,860, filed on May 9, 1989, now U.S. Pat. No. 5,096,842.

BACKGROUND OF THE INVENTION

1. Field of the Invention

The present invention relates to a very small, high-speed bipolar transistor in which base and emitter regions are self-aligned and which is used for a high-performance integrated circuit.

2. Description of the Related Art

A high-performance bipolar transistor is widely used for digital integrated circuit (IC) elements such as high-speed arithmetic processors, memories, and the like, and analog IC elements such as arithmetic amplifiers, comparators, and the like. In order to achieve high integration and high-speed operation of a bipolar IC, a bipolar transistor must be micronized in both lateral and longitudinal directions. As one micronization technology in the longitudinal direction of a bipolar transistor, a polysilicon-emitter technology using a polysilicon film as a doping source for a shallow emitter is widely used. For micronization in the lateral direction of a bipolar transistor, various self-alignment technologies for self-aligning a base and emitter using a two-layered polysilicon film have been proposed (e.g., (1) IEEE Transactions on Electron Devices, Vol. ED-33, No. 4, Apr. 1986, p. 57, (2) Japanese Patent Disclosure (Kokai) No. 58-7862, (3) ISSCC 87, 1987, p. 58, and the like). Cut-off frequencies of bipolar transistors obtained by these self-alignment technologies are about to reach 30 GHz.

However, the self-alignment technologies of the bipolar transistor proposed so far have the following problems.

First, a high-concentration emitter layer and a high-concentration external or draft base layer are formed very close to each other. For this reason, the breakdown voltage of a base-emitter junction is significantly decreased, and the capacitance of the base-emitter junction is increased. If the emitter layer and the external base layer are formed sufficiently separate from each other so as to solve this problem, the base resistance is increased, and high-speed operation is disturbed.

Second, if the emitter width is decreased to a submicron order, a decrease in current gain or cut-off frequency is observed. This will be described in detail below with reference to FIGS. 11A to 11C. In these drawings, a p-type active base layer 22 and a p$^+$-type external base layer 23 are formed in a wafer on which an n-type collector layer 21 is formed. An n$^+$-type emitter layer 24 is self-aligned in these base layers. A first polysilicon film 25 serves both as a doping source of the external base layer 23, and as a base electrode, and a second polysilicon film 26 serves both as a doping source for an emitter layer, and as an emitter electrode. These polysilicon films 25 and 26 are isolated by an oxide film 27. The emitter layer 24 is formed not by a method of directly doping an impurity in a wafer exposed surface but by a method wherein after a polysilicon film 26 is deposited and arsenic ions are doped in the film 26 by ion implantation, the doped arsenic ions are shallow diffused in the wafer by annealing. However, with this method, according to the experiments of the present inventors, a high current gain and cut-off frequency can be obtained only until an emitter width equals 0.8 μm. If the emitter width becomes smaller than 0.8 μm, these characteristics are greatly decreased. Broken curves in FIGS. 8 and 9 represent these data. The decreases in characteristic are caused for the following reason. If an opening for forming an emitter layer is decreased to as small as 0.4 μm, the film thickness t1 of the second polysilicon film 26 essentially becomes 1.5 to 2 times the thickness t1, i.e., a film thickness t2 in the emitter opening portion forming a narrow recess portion. In this state, even if ion implantation and annealing are performed in the second polysilicon film 26 under the same conditions as those when a sufficient emitter opening is formed, as shown in FIG. 11A, since the film thickness of the film 26 in the emitter opening portion is large, a predetermined emitter diffusion depth cannot be obtained. If the thickness of the preformed active base layer 22 is the same as that in FIG. 11A, the effective base width is increased as the emitter diffusion depth is decreased in FIG. 11B. If the film thickness of the second polysilicon film 26 is decreased, the film 26 can have an almost constant film thickness in a narrow emitter opening as in FIG. 11C. However, with this structure, since an effective emitter opening width $b$ is very small relative to a diffusion emitter opening width $a$, as shown in FIG. 11C, a predetermined emitter diffusion layer cannot be obtained. A thick portion of the second polysilicon film 26 formed on the side walls of the opening does not serve as an effective impurity doping source even if an impurity is doped by ion implantation in its surface portion. As the opening width $a$ is decreased, the ratio $b/a$ of the effective opening width $b$ to the opening width $a$ is decreased. Therefore, under the same ion-implantation and annealing conditions as those when the opening width is large, a predetermined emitter diffusion depth cannot be obtained. As a result, in both FIGS. 11B and 11C, an impurity having a concentration necessary for the emitter region cannot be supplied by the conventional polysilicon-emitter technology.

A variation in characteristics depending on an emitter width is very disadvantageous for a bipolar IC in which a plurality of elements are formed with different emitter widths. For example, in order to obtain an emitter layer diffusion depth necessary for an internal circuit portion constituted by small elements each having an emitter width of about 0.5 μm, the emitter layer diffusion depth becomes too large in an element such as an I/O buffer region having a large emitter width, resulting in a decrease in breakdown voltage.

Third, in the prior art, the active base layer and the emitter layer are self-aligned. However, the external base layer and the emitter layer are not self-aligned. More specifically, in FIG. 11A, the first polysilicon film 25 serving both as the doping source for the external base layer and as the base electrode is patterned to form an opening for forming the active base and the emitter. If mask misalignment occurs in this case, the external base layers formed on two sides of the emitter layer have different widths. This causes a variation in element characteristics.

Fourth, when a polysilicon film as a portion of a base electrode is patterned without using photolithography, a decrease in film thickness of the polysilicon film occurs. This problem will be described below with reference to FIGS. 12A and 12B. In this step, as shown in FIG. 12A, a predetermined recess portion is formed on a wafer 11 by an insulating film 12, and a polysilicon film 13 is deposited thereon. A photoresist 14 is coated to substantially flatten the surface of the resultant structure. Thereafter, the entire surface of the resultant structure is etched by dry etching to leave the photoresist 14 in only the recess portion. The polysilicon film 13 is etched by dry etching using the photoresist 14 as a mask so as to bury the polysilicon film 13 in the recess portion, as shown in FIG. 12B. However, in dry etching such as reactive ion etching, selectivity between the photoresist 14 and the polysilicon film 13 does not become high even if various conditions are properly selected. As a result, when the polysilicon film 13 on a stepped portion of the insulating film 12 is etched, the photoresist 14 is removed by etching at the same time, and the film thickness of the polysilicon film 13 to be buried is decreased, as shown in FIG. 12B.

SUMMARY OF THE INVENTION

It is an object of the present invention to provide a bipolar transistor having a micronized structure, which has a sufficient base-emitter breakdown voltage and a small base-emitter junction capacitance.

It is another object of the present invention to provide a method of fabricating a bipolar transistor, which has a very small emitter width on a submicron order, and is free from deterioration of relevant characteristics.

Yet another object of the present invention is to provide a method of fabricating a bipolar transistor in which an external base layer, an active base layer, and an emitter layer are self-aligned, and which can provide excellent element characteristics.

It is still another object of the present invention to provide a method of fabricating a bipolar transistor, in which burying of a polysilicon film as a portion of a base electrode is performed without decreasing the film's thickness.

A bipolar transistor according to the present invention has basically a planar structure. In this structure, a base layer of a second conductivity type, constituted by an active base layer and a high-concentration external base layer formed deeply around the active base layer by diffusion, is formed in a surface portion of a collector layer of a first conductivity type, and an emitter layer is self-aligned in the surface portion of the active base layer. In this basic structure, the bipolar transistor of the present invention has an insulating film which is buried deeper than the level of the junction between the active base layer and the collector layer and which is formed around the emitter layer.

In a first method of the present invention, the step of burying a photoresist in a recess portion on a wafer and converting at least a surface portion of the photoresist into a carbonized layer before a material film under the photoresist used as a mask is etched by dry etching, is used in the formation of a base region. More specifically, a method of fabricating a bipolar transistor according to the present invention comprises the steps of:

sequentially depositing a first insulating film and a second insulating film, which has a thickness larger than, and is formed of a material different from, that of the first insulating film, on a semiconductor wafer having a collector layer of a first conductivity type;

selectively etching the second insulating film to form a recess portion on an external base forming region and a base electrode forming region of the bipolar transistor;

depositing a first polysilicon film, which serves as a portion of a base electrode and contains an impurity, on the entire surface of the structure by a film formation method with good step-coverage;

burying a photoresist in a recess portion formed on the surface of the first polysilicon film;

performing ion implantation to convert at least a surface portion of the photoresist into a carbonized layer;

etching the first polysilicon film by anisotropic dry etching, using the photoresist converted to the carbonized layer as a mask, so as to expose the second insulating film;

continuously etching the first polysilicon film, using the exposed second insulating film and the photoresist as a mask, so as to expose the first insulating film of the external base forming region;

selectively etching the exposed first insulating film using the photoresist, and the second insulating film as a mask, so as to expose a wafer surface;

removing the photoresist and burying a second polysilicon film in the recess portion surrounded by the second insulating film;

removing the second insulating film on an active base forming region and then performing thermal oxidation so that an oxide film is formed on the surface of the second polysilicon film, and at the same time, an impurity doped in advance in the second polysilicon film or the semiconductor wafer is diffused in the collector layer so as to form an external base layer of a second conductivity type; and removing the first insulating film on the active base forming region and sequentially forming a active base layer of the second conductivity type and an emitter layer of the first conductivity type on the exposed wafer surface.

A second method of the present invention is a method of fabricating a transistor with a micronized structure, having an emitter with a width of 0.8 μm or less, by polysilicon-emitter technology, and comprises the steps of:

forming a base layer of a second conductivity type in a surface portion of a collector layer of a first conductivity type formed in a semiconductor wafer, the base layer being constituted by an active base layer and an external base layer having a higher concentration and a larger depth than the active base layer;

selectively doping an impurity of the first conductivity type in a surface portion of the active base layer by ion implantation;

depositing a polysilicon film to be in contact with the doped region and which serves as a portion of an emitter electrode, and doping an impurity of the first conductivity type in the polysilicon film by ion implantation; and activating the doped impurities by rapid thermal annealing.

A third method of the present invention is a modified method of the second method. The third method has the same steps as those of the second method until an active base layer is formed. Thereafter, a polysilicon film doped with an impurity of a first conductivity type upon film formation is deposited without performing ion implantation on the surface of the base layer. The doped impurity is activated by rapid thermal annealing.

A fourth method of the present invention is a double polysilicon technology which can suppress a decrease in the performance of a bipolar transistor having a very small emitter width of 0.8 μm or less, and allows complete self-alignment among an external base, active base, and emitter. More specifically, the fourth method comprises the steps of:

forming a first mask material film on a wafer having a collector layer of a first conductivity type and patterning the first mask material film to be left on a region including an emitter forming region;

depositing a first conductive material film serving as a base electrode on the entire surface of the wafer, and burying a second mask material film in a recess portion formed on the surface of the first conductive material film;

selectively etching the first conductive material film using the first and second mask material films as masks to form a first opening used for active base formation;

removing the second mask material film and burying a second conductive material film serving as the base electrode together with the first conductive material film in the first opening;

removing the first mask material film to form a second opening used for active base layer formation;

forming a thermal oxide film on the surface of the second conductive material film, and at the same time, diffusing an impurity doped in advance in the surface of the second conductive material film or the semiconductor wafer in the collector layer so as to form an external base layer of a second conductivity type;

doping an impurity in the wafer surface in the second opening to form an active base layer of the second conductivity type;

exposing the wafer surface in the second opening in which the active base region is formed and doping an impurity giving the first conductivity type with a very shallow depth in the exposed wafer surface;

depositing a third conductive material film in contact with the impurity layer and serving as a portion of an emitter electrode;

doping an impurity giving the first conductivity type in the third conductive material film; and activating the doped impurities by rapid thermal annealing.

A fifth method of the present invention is a combination of the fourth method and the step of carbonizing a photoresist surface used in the second method.

BRIEF DESCRIPTION OF THE DRAWINGS

FIG. 1 is a sectional view showing a structure of a bipolar transistor according to an embodiment of the present invention;

FIGS. 2A to 2H are sectional views showing steps in the fabrication of the transistor shown in FIG. 1;

FIG. 3 is a sectional view showing a modification of FIG. 1;

FIGS. 4A to 4D are sectional views showing steps in the fabrication of a bipolar transistor according to another embodiment of the present invention;

FIGS. 7A to 7H are sectional views showing steps in the fabrication of a bipolar transistor according to still another embodiment of the present invention;

FIG. 8 is a graph showing the relationship between an emitter width and a current gain of a transistor;

FIG. 9 is a graph showing the relationship between an emitter width and a cut-off frequency of a transistor;

FIGS. 10A to 10H are sectional views showing steps in the fabrication of a bipolar transistor according to still another embodiment of the present invention;

DETAILED DESCRIPTION OF THE PREFERRED EMBODIMENTS

Figure 5A:
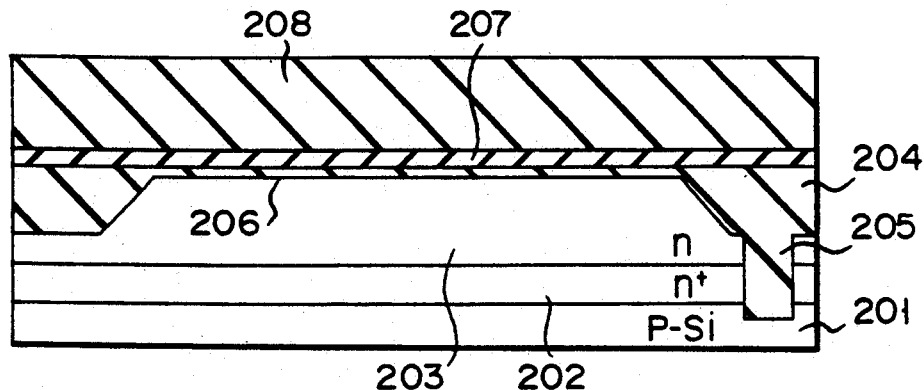
FIGS. 5A to 5F are sectional views showing steps in the fabrication of a bipolar transistor according to yet another embodiment of the present invention.

In an embodiment shown in FIG. 1, a wafer in which an $n^+$-type buried layer 102 is formed on a p-type substrate 101, and an n-type epitaxial layer 103 serving as a collector layer is formed thereon. A $p^+$-type external base layer 116, a p-type active base layer 118, an $n^+$-type emitter layer 121, and an $n^+$-type collector contact layer 122 are formed in a region of the wafer surrounded by an element isolation oxide film 105. The external base layer 116 is formed to have a larger depth and a higher concentration than the active base layer 118. Polysilicon films 110 and 113 are used as impurity doping sources for forming the external base layer and portions of the base, and polysilicon films 123 and 124 are used as portions of collector electrodes. The active base layer 118 and the emitter layer 121 are self-aligned using an opening defined by the polysilicon films 110 and 113, and a thermal oxide film 117 formed on the surface of the film 113. A polysilicon film 120 is used as a doping source for forming the emitter layer 121 and a portion of the emitter electrode. A barrier insulating film 115 is buried in a portion around the emitter layer 121 to be deeper than the junction level between the active base layer 118 and the collector layer 103. The collector contact layer 122 is formed by ion-implanting an impurity through the polysilicon films 123 and 124, serving as a portion of the collector electrode.

The steps in the fabrication of the transistor in the embodiment shown in FIG. 1 will now be described with reference to FIGS. 2A to 2H. In FIGS. 2A to 2H, the collector contact layer portion is omitted, and only the base and emitter regions are illustrated. Grooves are formed between an element isolation region, a base forming region, an emitter forming region, and a collector contact region of an expitaxial wafer, then an element isolation oxide film 105 and an electrode isolation oxide film 104 are formed in these grooves by a LOCOS method. A 500-Å thick silicon oxide film 106 is formed by thermal oxidation on the wafer which is subjected to element isolation as described above. A 1,500-Å thick silicon nitride film 107 is then formed as an antioxidation insulating film by LPCVD. A 6,000-Å thick silicon oxide film 108 is deposited on the silicon nitride film 107 by normal-pressure CVD (FIG. 2A).

The oxide film 108 is patterned by photoetching so as to leave a region which includes an emitter region. The silicon nitride film 107 is selectively etched using the remaining oxide film 108 as a mask. Then, a 1,000-Å thick silicon oxide film 109 is deposited by normal-pressure CVD, and a 4000 Å thick first polysilicon film 110 used as a portion of the base electrode is then deposited by LPCVD (FIG. 2B).

A photoresist 111 is then coated, and the entire surface of the photoresist is etched by plasma etching, so that the photoresist is left in a recess portion formed in the surface (FIG. 2C).

The polysilicon film 110 is etched by reactive ion etching (RIE) using the photoresist 111 as an etching mask. When a top of the oxide film 109 is exposed, the polysilicon film 110 continues to be etched using the oxide film 109 as a mask until the underlying oxide film 108 is exposed. The lower oxide films 108 and 106 are etched to form a first opening 112 sandwiched between the photoresist 111, and the oxide films 108 and the oxide film 109 left on the side wall of the film 108 (FIG. 2D). Thereafter, the photoresist 111 is removed by ashing.

A second polysilicon film 113 is then deposited. Boron ions are doped by ion implantation in the polysilicon film 113 as an impurity for forming the external base. The entire surface of the polysilicon film 113 is etched by plasma etching so that the film 113 is buried in the first opening 112 and on the first polysilicon film 110 (FIG. 2E).

A photoresist (not shown) having an opening at a position corresponding to the element region is formed by patterning. The oxide films 108, 109, and 106 on the emitter forming region are selectively etched using the photoresist pattern. Thus, a second opening 114 is formed in a region sandwiched between the silicon nitride film 107 on the emitter forming region and the polysilicon film 113. Oxygen ions are doped by ion implantation in the wafer exposed from the second opening 114, and are annealed, thereby forming a barrier insulating film 115 constituted by the oxide film which is buried to surround the emitter forming region (FIG. 2F). The level of the insulating film 115 is deeper than that of the junction between the active base layer formed later and the collector layer 103. Note that ion-implantion conditions of oxygen are varied depending on the depth of the barrier insulating film 115 to be formed. For example, if oxygen ions are doped by ion implantation at an acceleration voltage of about 30 keV, a 600-Å deep barrier insulating film can be easily formed.

An oxide film 117 is formed by thermal oxidation on the surfaces of the first and second polysilicon film 110 and 113. The oxide film 117 serves as an electrode isolation insulating film for the base and emitter. By means of this thermal oxidation step, and the annealing step for forming the above-mentioned barrier insulating film 115, boron ions doped in the second polysilicon film 113 are diffused in the wafer, thereby forming a p+-type external base layer 116 (FIG. 2F).

Thereafter, the silicon nitride film 107 is removed by plasma etching, and boron ions are doped to form an active base layer 118. A third polysilicon film 119 is deposited thereafter, and is etched by anisotropic etching to be left on the side walls of the emitter opening portion. Using the remaining third polysilicon film 119 as a mask, the oxide film 106 in the emitter forming region is removed. A fourth polysilicon film 120 serving as the emitter electrode is deposited by LPCVD, and arsenic ions are doped therein by ion implantation. The resultant structure is annealed to diffuse the arsenic ions in the fourth polysilicon film 120 in the wafer, thereby forming an emitter layer 121, self-aligned with the active base layer 118 (FIG. 2H).

As described above, a bipolar transistor in which the external base layer, the emitter barrier insulating film, and the emitter layer are self-aligned can be obtained. According to this embodiment, since the barrier insulating film 115 surrounding the emitter layer is buried, if the high-concentration emitter layer 121 and the high-concentration external base layer 116 are formed adjacent to each other, the emitter-base breakdown voltage can be set to be sufficiently high. Since the external base layer 116 partially extends below the barrier insulating film 115 to the end portion of the emitter layer 121, a low base resistance can be maintained, and the base-emitter junction capacitance is also sufficiently small. The cut-off frequency of the bipolar transistor of this embodiment is high, regardless of a collector current. More specifically, since a lightly doped region with a small collector current has a low base-emitter junction capacitance, the cut-off frequency is high. Since a heavily doped region can easily discharge stored charges of the base, the cut-off frequency is also high.

In this embodiment, the external base layer is formed by utilizing diffusion from the polysilicon film. Alternatively, boron ions may be doped by ion implantation in advance in the state of FIG. 2D, and may be diffused in the thermal oxidation step of the polysilicon film.

FIG. 3 shows a bipolar transistor obtained by slightly modifying the embodiment shown in FIG. 1. Therefore, the same reference numerals in FIG. 3 denote the same portions as in FIG. 1, and a detailed description hereof will be omitted. In the embodiment, after the active base layer 118 is formed, the emitter layer 121 is formed after the step of narrowing the opening by the third polysilicon film 119. In this modification, the active base layer and the emitter layer are formed through the same opening. Therefore, in this modification, the width of the emitter layer is determined by the barrier insulating film 115.

In this modification, the emitter junction terminates to the surrounding barrier insulating film 115. As a result, the emitter region has no corners where an electric field is concentrated, thus further increasing the emitter-base breakdown voltage.

A method of improving the mask effect of a photoresist by carbonizing it through ion implantation, and an embodiment of fabricating a bipolar transistor having a micronized structure to which the method is applied, will be described in detail below.

As is already known, most constituting elements excluding carbon are discharged in at least a surface portion upon ion implantation in a photoresist, so as to form a carbonized layer having a high carbon concentration (e.g., Nuclear Instruments and Methods in Physics Research 1985, pp. 501–506). When a carbonized layer is formed in at least a surface portion of a photoresist pattern by utilizing this phenomenon, the etching rate of the photoresist by dry etching can be greatly reduced. As a result, etching selectivity with respect to a material to be etched can be set to be sufficiently high. Even when a thick material is etched by self-alignment technology, the mask effect of the photoresist is assured.

FIGS. 4A to 4D are sectional views showing the steps in a patterning method of a polysilicon film utilizing the above-mentioned technology. As shown in FIG. 4A, a thick CVD oxide film 12 is deposited on a silicon substrate 11, and is patterned to form a first recess surrounded by the oxide film 12. A polysilicon film 13 is formed on the surface of the resultant structure by a method having a good step-coverage, e.g., LPCVD. After a pre-treatment, such as rinsing, is performed, a photoresist 14 is coated on the entire surface, and a post-treatment such as baking is performed. The photoresist 14 is coated so as to have a substantially flat surface. As shown in FIG. 4B, the entire surface of the photoresist 14 is etched by RIE or the like, so that the photoresist 14 is patterned to be left only in a second recess region defined by the polysilicon film formed on the first recess portion. Thereafter, ion implantation is performed using, for example, boron as an ion seed, and the ion implantation is performed at an acceleration voltage of 50 keV and a dose of $5 \times 10^{15}/cm^2$. As shown in FIG. 4C, a carbonized layer 15 is formed in the surface portion of the photoresist 14. Thereafter, the polysilicon film 13 is etched by RIE using the photoresist 14 as a mask, and is buried in the recess portion surrounded by the oxide film 12. By removing the photoresist 14, the pattern of the self-aligned polysilicon film 13 can be formed in the recess portion, as shown in FIG. 4D.

With this method, since the carbonized layer 15 is formed in the surface portion of the photoresist 14, the etching rate of the photoresist 14 by RIE is largely decreased, and an excellent mask effect can be obtained. As a result, the polysilicon film 13 can be patterned without the accompanying decrease in film thickness.

Figure 6:
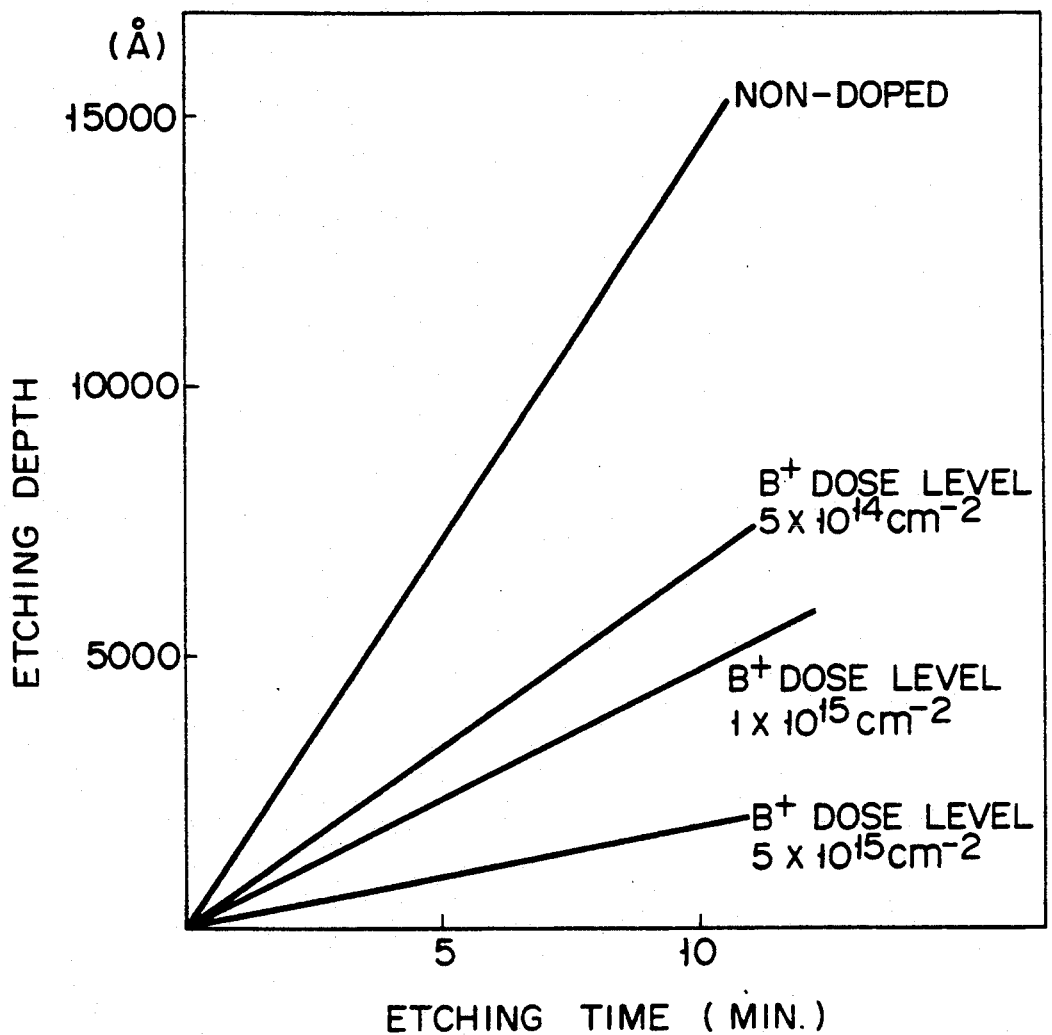
FIG. 6 is a graph showing a change in etching characteristics of a photoresist by ion implantation.

FIG. 6 shows experimental results concerning the relationship between a dose of boron in the photoresist and etching rate by RIE. This data reveals that the etching rate of the photoresist is greatly decreased by ion implantation.

Figure 5B:
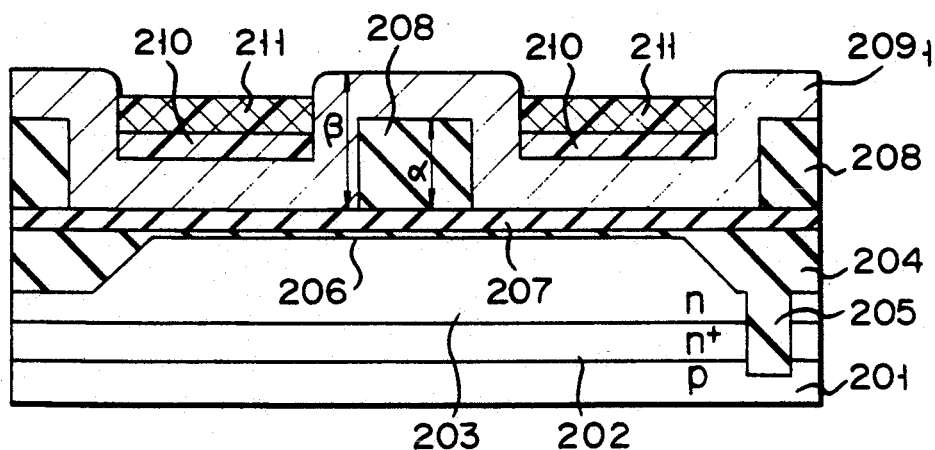

FIGS. 5A to 5F are sectional views showing steps in an embodiment wherein the above-mentioned patterning method is applied to fabrication of a bipolar transistor. In this embodiment, a wafer in which an n-type layer 203 serving as a collector layer is epitaxially grown on a p-type silicon substrate 201 through an $n^+$-type buried layer 202 is used as in the above embodiment. Isolation oxide films 204 and 205 are formed by the LOCOS method on an isolation region, so as to isolate the base and collector electrodes. A thermal oxide film 206 and a CVD silicon nitride film (first insulating film) 207, serving as an antioxidation film, is sequentially deposited on the wafer. Thereafter, a thick CVD silicon oxide film (second insulating film) 208 is deposited (FIG. 5A). The oxide film 208 is patterned by selective etching to form a first recess portion in an external base forming region and a base electrode forming region surrounded by the oxide film 208 as shown in FIG. 5B. A first polysilicon film $209_1$ as a portion of the base electrode is deposited on the entire surface of the resultant structure by CVD. A photoresist 210 is coated and the entire surface of the coated photoresist is etched to be buried in a second recess region formed in the surface of the first polysilicon film $209_1$ in the first recess portion. Ion implantation is performed in the buried photoresist 210 to form a carbonized layer 211 in at least the surface portion of the photoresist 210 (FIG. 5B). In this case, boron is used as an ion seed since the transistor of this embodiment is an npn transistor.

Figure 5C:
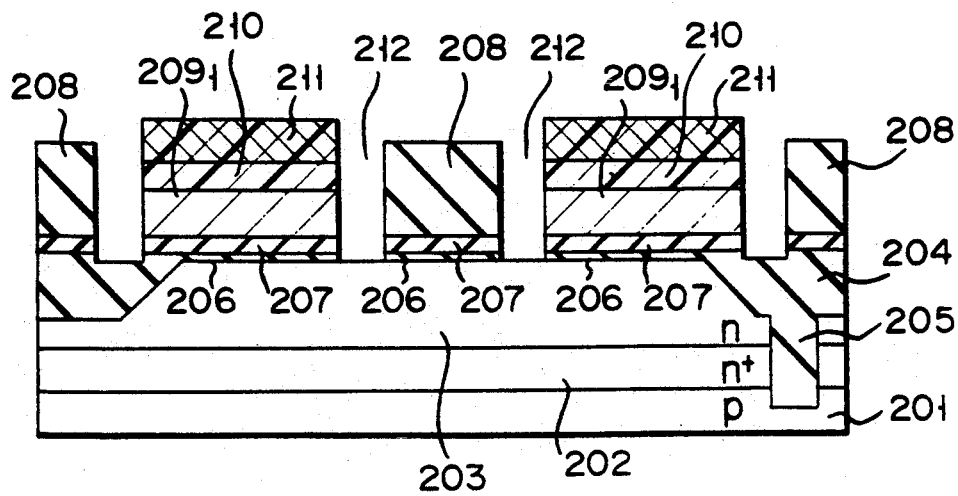

The polysilicon film $209_1$ is etched by RIE using the photoresist 210, formed with the carbonized layer 211 by ion implantation as a mask. After the oxide film 208 is exposed, the polysilicon film $209_1$ is continuously etched using the oxide film 208 as a mask, thereby removing the polysilicon film $209_1$ in a gap portion between the oxide film 208 and the photoresist 210; specifically, the polysilicon film $209_1$ is left only under the photoresist 210. The exposed nitride film 207 is removed by RIE using the photoresist 210 and the oxide film 208 as masks, and the thermal oxide film 206 under the film 207 is further removed to expose part of the wafer surface of the external base forming region (FIG. 5C). Thus, an opening 212, having a width defined by the film thickness of the polysilicon film $209_1$, is formed between the oxide film 208 and the photoresist 210.

Figure 5D:
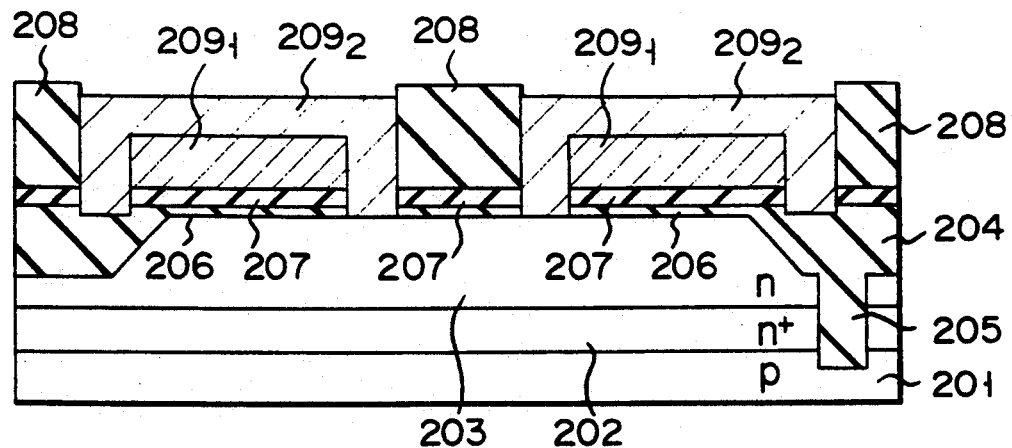
Figure 5E:
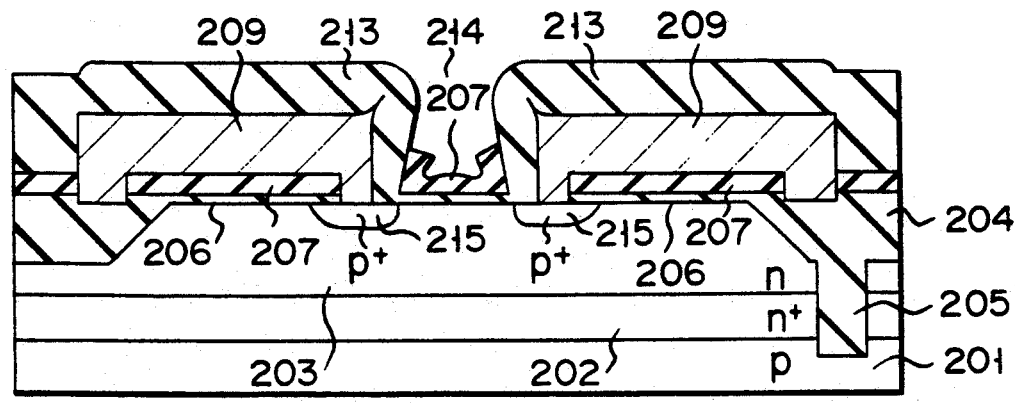

Thereafter, the photoresist 210 is removed, and a second polysilicon film $209_2$ is deposited on the entire surface of the structure. The entire surface of the polysilicon film $209_2$ is etched, so that the second polysilicon film $209_2$ is buried by self-alignment in the recess region surrounded by the oxide film 208 (FIG. 5D). The polysilicon film $209_2$ contacts the wafer surface through the very small opening 212 around the oxide film 208. Thereafter, boron ions are doped in the first and second polysilicon films $209_1$ and $209_2$, then the oxide film 208 on the emitter region is removed by using a photoresist pattern (not shown), thus forming an opening 214, used for forming an active base. An oxide film 213 is formed on the surface of the polysilicon film 209, by performing thermal oxidation using the exposed nitride film 207 as a mask, and the boron ions in the film 209 are simultaneously diffused to form an external base layer 215 (FIG. 5E).

Figure 5F:
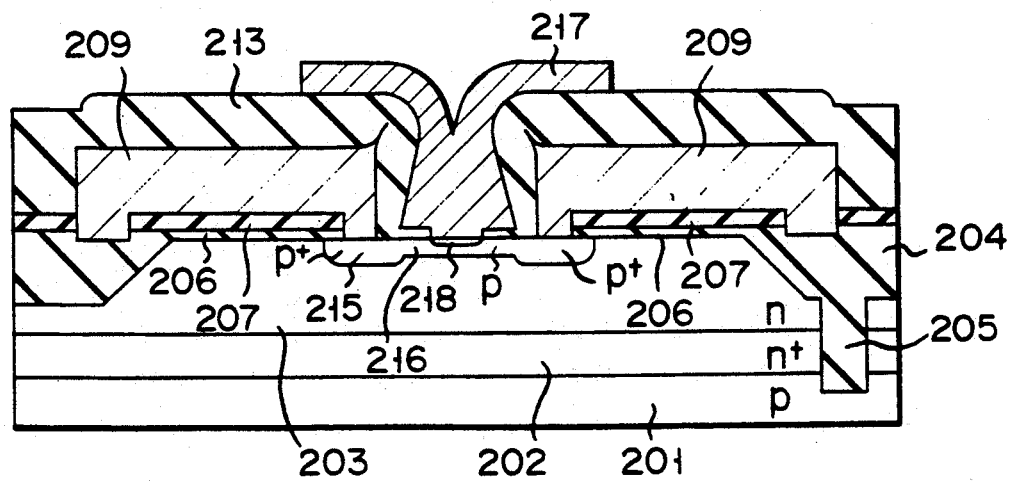

Thereafter, the nitride film 207, used as the mask for thermal oxidation, is removed and the underlying oxide film 206 is removed to expose the wafer surface. A thin oxide film is formed again, and boron ions are doped by ion implantation, thereby forming an active base layer 216. The thin oxide film is then removed, and a third polysilicon film 217 is deposited. Arsenic ions are doped in the polysilicon film 217 and are annealed, thereby forming an emitter layer 218 (FIG. 5F). The third polysilicon film 217 is used as a portion of the emitter electrode. Although not shown, a contact hole is finally formed, and a metal electrode layer is formed, thus completing the transistor.

In the fabrication of a transistor in which the emitter and base are self-aligned, the etching step of the polysilicon film $209_1$ shown in FIGS. 5B and 5C poses a problem. A film thickness c of the oxide film 208 for forming the recess portion on the wafer surface is preferably selected to be about 8,000 Å. and the film thickness of the first polysilicon film $209_1$ is selected to be 4,000 Å since it determines the size of the base contact. As a result, a thickness $\beta$ required for etching the polysilicon film $209_1$ is about 12,000 Å. Contrary to this, the thickness $\gamma$ of the photoresist 210 buried in the recess portion is a minimum value in the surface, i.e., about 2,000 Å, since it is buried by entire-surface etching. If there is such a difference between the film thicknesses of the photoresist 210 as the mask and the polysilicon film as a material film to be etched, etching selectivity must be set to be 6 or more. For example, if the polysilicon film is selectively etched using a 2,000-Å thick non-carbonized photoresist, the photoresist disappears when the polysilicon film is etched by only about 2,500 Å. According to the experiments of the present inventors, if boron ions are doped in the photoresist at an acceleration voltage of 50 keV and a dose of $5 \times 10^{14}/cm^2$, an 8,000-Å thick polysilicon film can be etched before the photoresist disappears. If the dose of the boron is increased to $5 \times 10^{15}/cm^2$, an 800 Å thick photoresist still remains after the polysilicon film is etched by 12,000 Å. In an actual process, a 1.2-μm thick polysilicon film is assumed to be over-etched by about 20%. In this case, if a non-doped photoresist is used as a mask, this photoresist is etched by about 1 μm. In contrast to this, if boron ions are doped in the photoresist at an acceleration voltage of 50 keV and a dose of $5 \times 10^{15}/cm^2$, the etching amount of the photoresist can only be about 1,400 Å. Therefore, when the ion implantation conditions are appropriately selected, not only the polysilicon film but also the underlying nitride film and oxide film can be successively etched using the photoresist as a mask.

According to this embodiment, when a self-aligned transistor, in which a micronized base contact region is formed by RIE, is obtained, ion implantation is performed in the photoresist buried in the recess portion by self-alignment to form a carbonized layer, so that a relatively high mask effect can be obtained even if a relatively thin photoresist is used. As a result, a decrease in film thickness of the polysilicon film serving as a portion of the base electrode can be prevented. Therefore, a micronized transistor having excellent characteristics can be obtained. As in the embodiment shown in FIGS. 2A to 2H, the emitter, the active base, and the external base are completely self-aligned.

In this embodiment, the external base layer is formed by impurity diffusion from the polysilicon film. Alternatively, ion implantation may be performed in the state of FIG. 5C, and doped ions may be diffused in the following annealing step so as to form the external base layer.

FIGS. 7A to 7H show steps in the fabrication of a bipolar transistor according to still another embodiment of the present invention. This embodiment is an improvement of the polysilicon emitter technology. More specifically, ion implantation is performed in advance before an emitter polysilicon film is deposited or an impurity is doped in the polysilicon film simultaneously with deposition of the polysilicon film, thus assuring a required impurity concentration of an emitter even when an emitter opening becomes small. Annealing for forming the emitter is performed under these conditions, enough to activate an impurity but not to diffuse the impurity. Such conditions can be obtained by utilizing rapid thermal annealing, thus preventing an increase in depth of the emitter diffusion layer, and impurity redistribution in the already formed base layer, and the like. High-performance characteristics free from decreases in current gain and cut-off frequency can be obtained while maintaining a small emitter width.

Figure 7A:
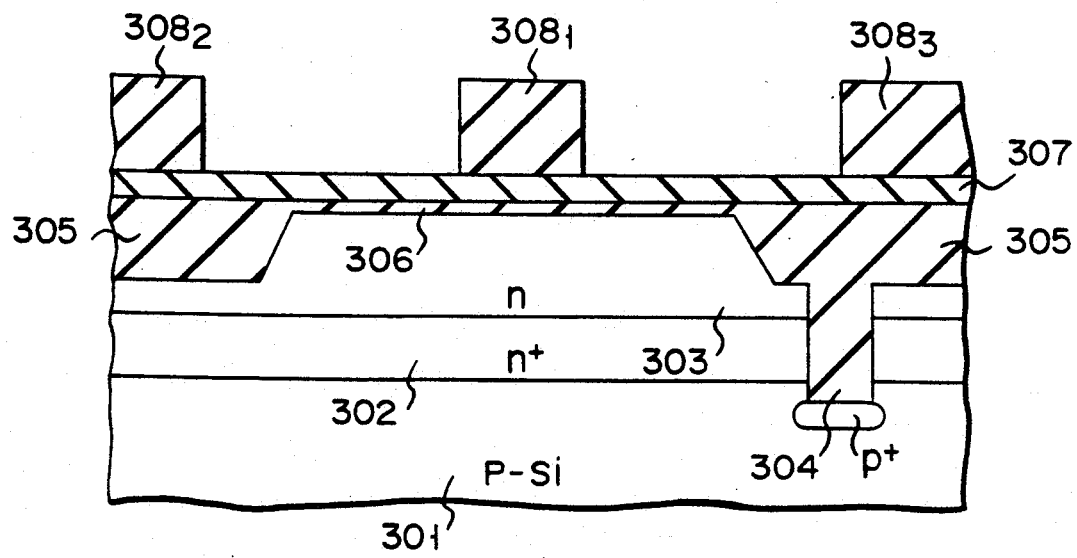

An n+-type buried layer 302 is formed in a p-type Si substrate 301, and an n-type epitaxial layer 303 serving as a collector layer is formed thereon. The n-type epitaxial layer 303 is formed by vapor growth as an n-type layer having an impurity concentration of $1 \times 10^{16}/cm^3$. A deep groove is formed in an element isolation region of this wafer, and a shallow groove is formed in an isolation region between base region and a collector contact region. Thereafter, selective oxidation is performed, so that an element isolation oxide film 304 and an electrode isolation oxide film 305 are formed in these grooves. Note that the collector contact region is not shown. A 200-Å thick silicon oxide film 306 is formed by thermal oxidation on the entire surface of the wafer which is subjected to element isolation as described above. A 1,000-Å thick CVD silicon nitride film 307 is deposited as an antioxidation insulating film. Furthermore, a 5,000-Å thick CVD oxide film 308 is deposited as a first mask material film. The CVD oxide film 308 is patterned by photoetching, thus leaving an oxide film pattern on a prospective active base region portion and the element isolation region. More specifically, a state wherein a recess portion is formed by the oxide film pattern in the external base forming region and the base electrode forming region is obtained (FIG. 7A). In this case, patterning is performed by RIE, so that the thick oxide film 308 has an almost vertical wall.

Figure 7B:
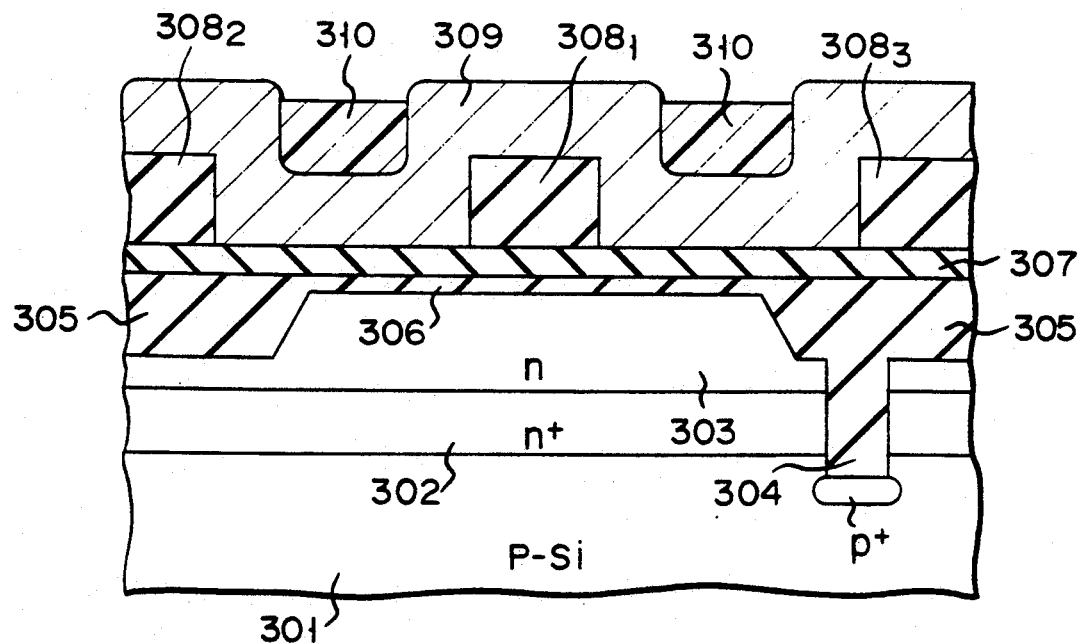

A first polysilicon film 309 is deposited by CVD as a first conductive material film. The film thickness of the first polysilicon film 309 is about 3,500 Å. A recess portion, reflecting the recess portion formed by the oxide film 308 pattern, is formed on the surface of the first polysilicon film 309. A photoresist 310 is coated, as a second mask material film, on the entire surface of the structure so as to have an almost flat surface. Thereafter, the entire surface of the resultant structure is etched in an $O_2$ plasma atmosphere, thereby exposing the surface of the first polysilicon film 309 on the oxide film 308 (FIG. 7B). More specifically, a state wherein the photoresist 310 is buried in the recess portion of the first polysilicon film 309 is obtained.

The first polysilicon film 309 is etched by RIE, using the photoresist 310 as a mask, to expose the oxide film 308. After the oxide film 308 is exposed, the polysilicon film is kept etched using the oxide film pattern 308 as a mask together with the photoresist 310. The first polysilicon film 309 continues to be etched until it is left only under the photoresist 310. Furthermore, the exposed nitride film 307 is also removed by etching. These etching operations can be achieved by anisotropic dry etching. For example, RIE free from formation of overhangs is preferably used. When the nitride film 307 is etched and the oxide film 306 is exposed, the oxide film 306 is removed by etching using an $NH_4F$ solution so as to expose the wafer surface. In this manner, a first opening A used for forming an external base region is formed (FIG. 7C). Note that etching of the oxide film for exposing the wafer surface can also be achieved by RIE. Since sufficiently high etching selectivity can be set between the oxide film and the epitaxial layer, damage to the wafer can be prevented.

Figure 7E:
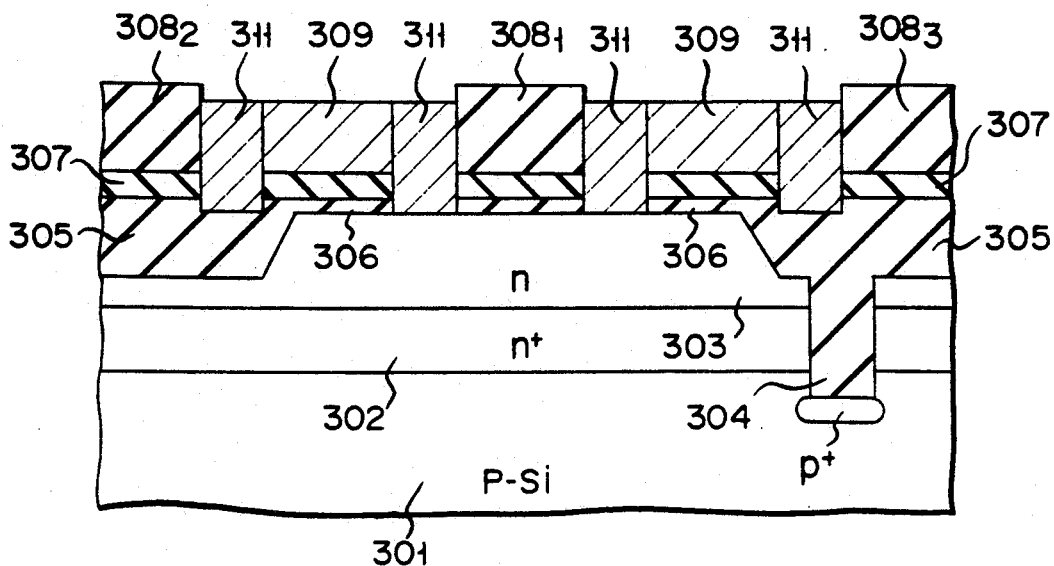

Thereafter, the photoresist 310 is removed. After a 6,000-Å thick second polysilicon film 311 is deposited as a second conductive material film, the entire surface of the film 311 is etched by plasma etching. As a result, in a state wherein the surface of the oxide film 308 is exposed, the second polysilicon film 311 is buried in the opening A (FIG. 7E). In this case, etching conditions are selected, so that the first and second polysilicon films 309 and 311 have flat surfaces. The film thickness of the second polysilicon film 311 need only be half or more of the width of the first opening A. However, in order to obtain practical flatness, the film thickness is preferably 1.5 times of the width of the first opening A.

In this state, ion implantation is performed, so that boron ions are doped in the second polysilicon film 311. In this case, the boron ions may be doped not only in the second polysilicon film 311 but also in the first polysilicon film 309. Ion-implantation conditions of boron are an acceleration voltage of 50 keV and a dose of $1 \times 10^{16}/cm^2$.

Figure 7F:
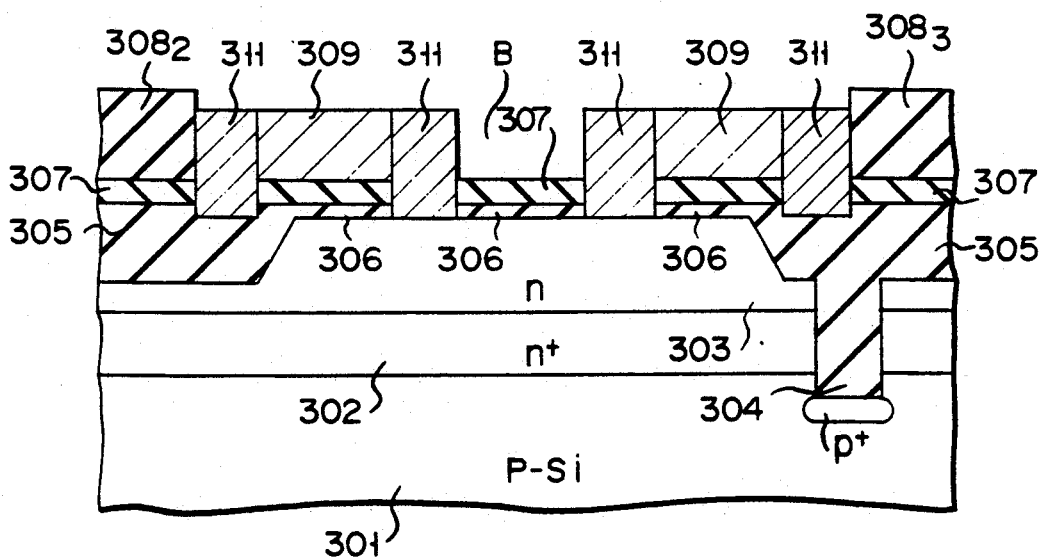
Figure 7G:
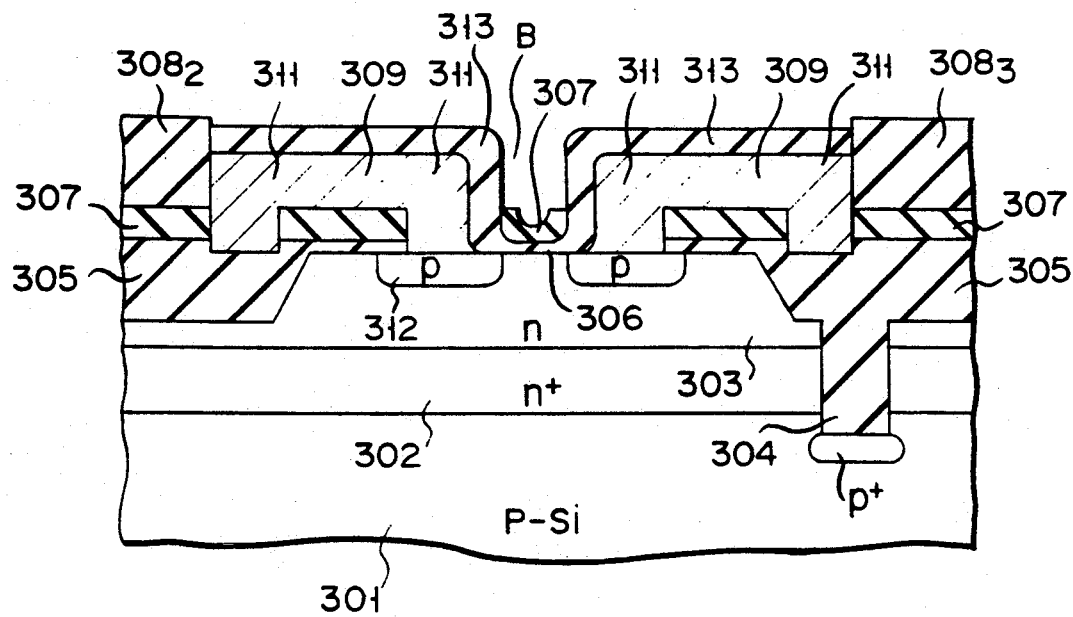
Figure 7H:
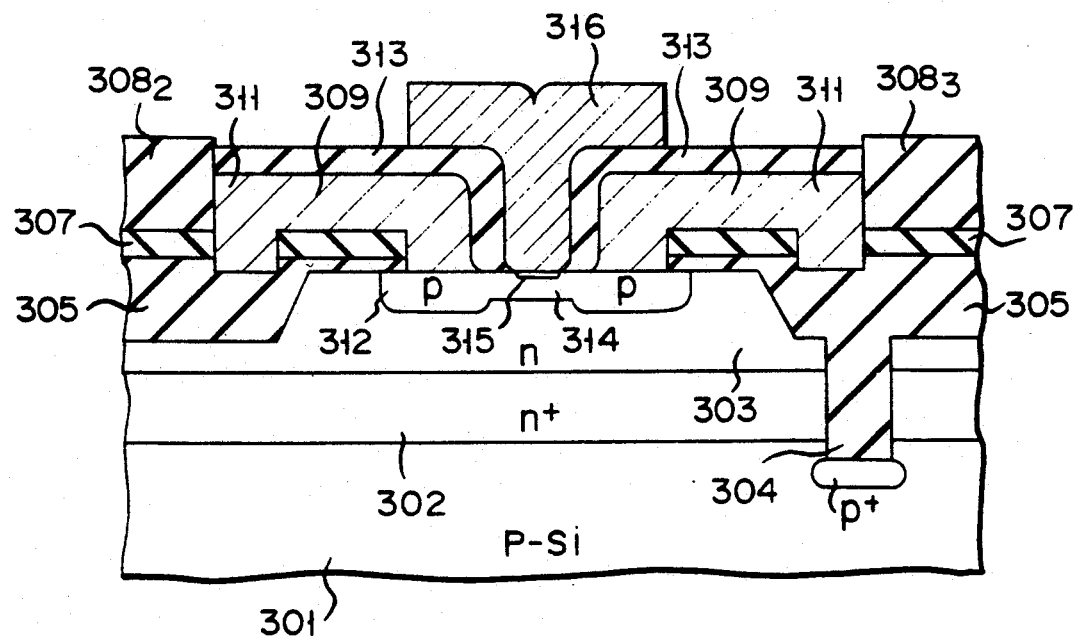
Figure 10A:
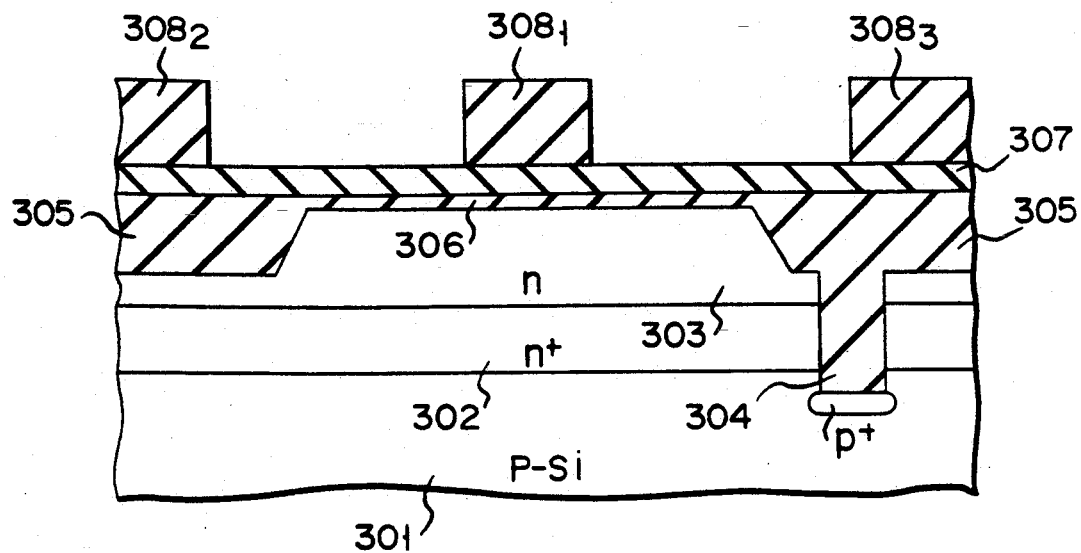
Figure 10B:
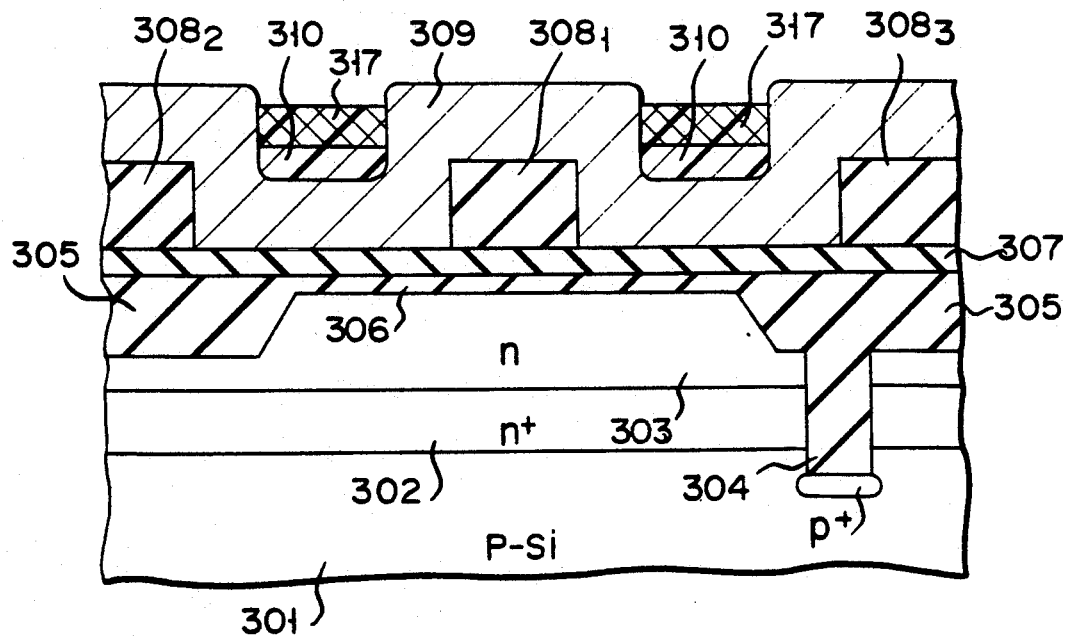
Figure 10E:
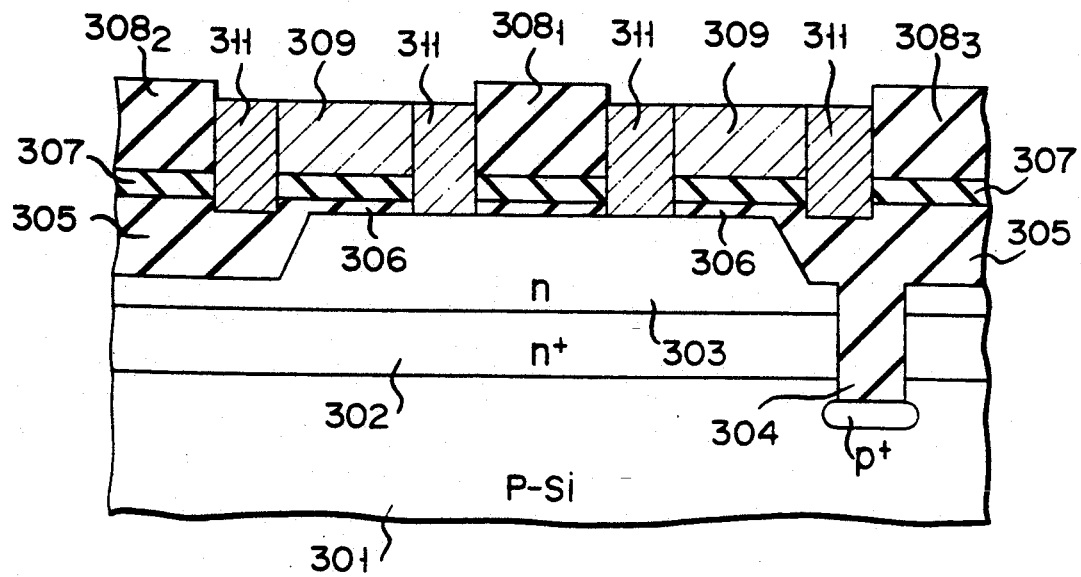
Figure 10F:
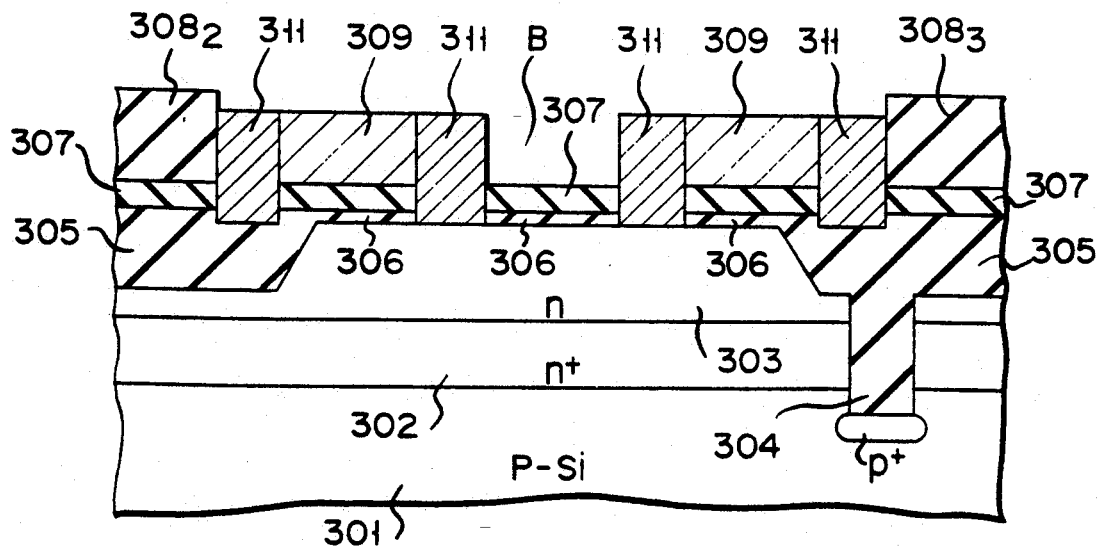
Figure 10G:
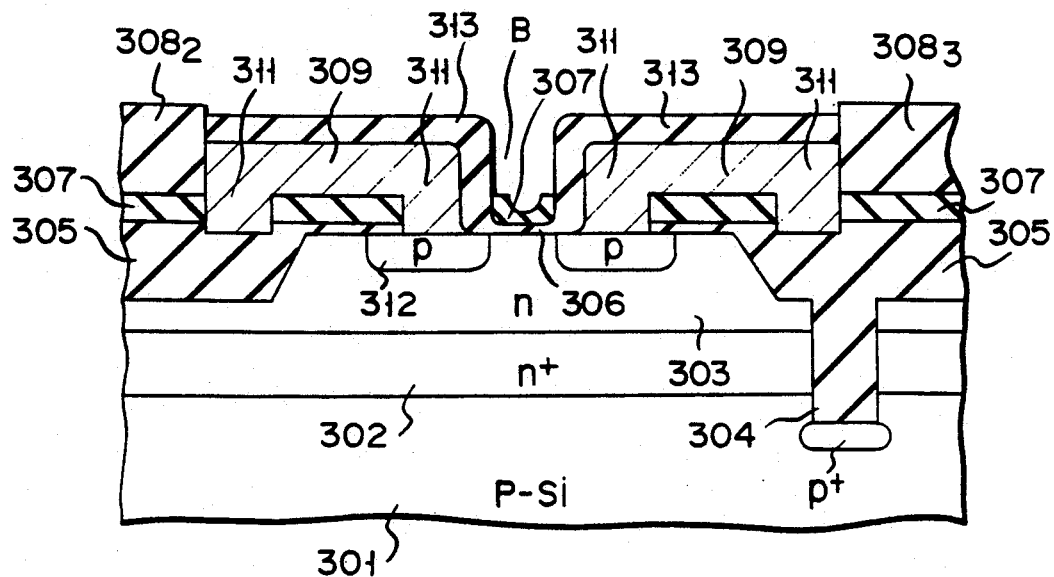
Figure 10H:
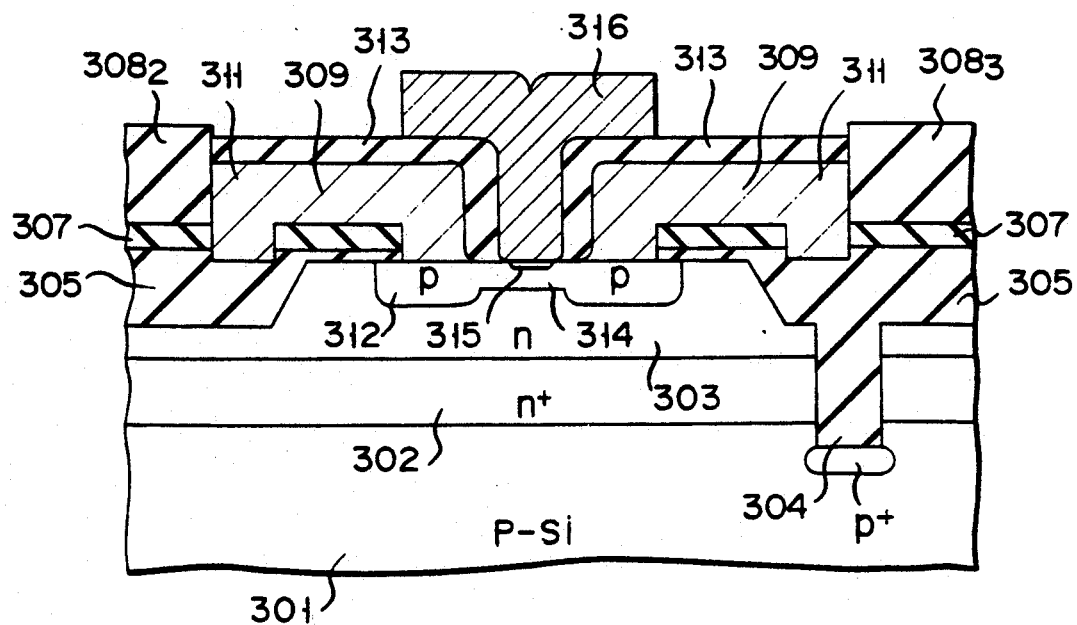
Figure 11A:
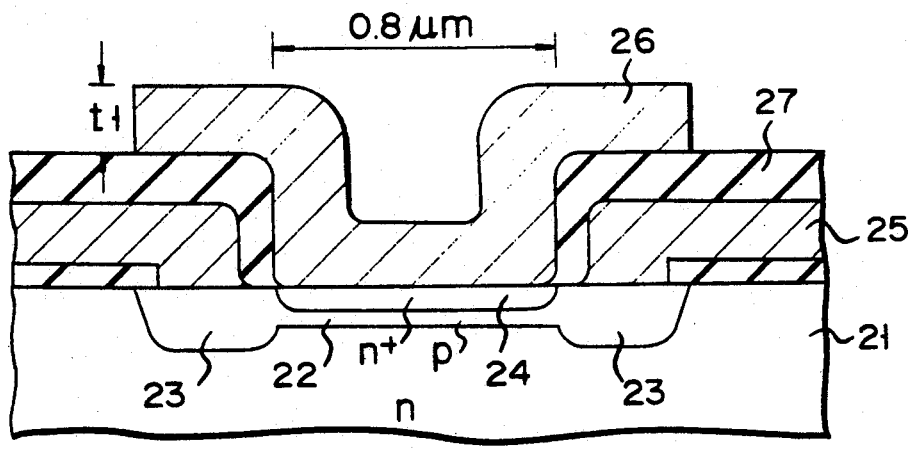
FIGS. 11A to 11C are sectional views for explaining conventional problems occurring when the emitter width is decreased.
Figure 11B:
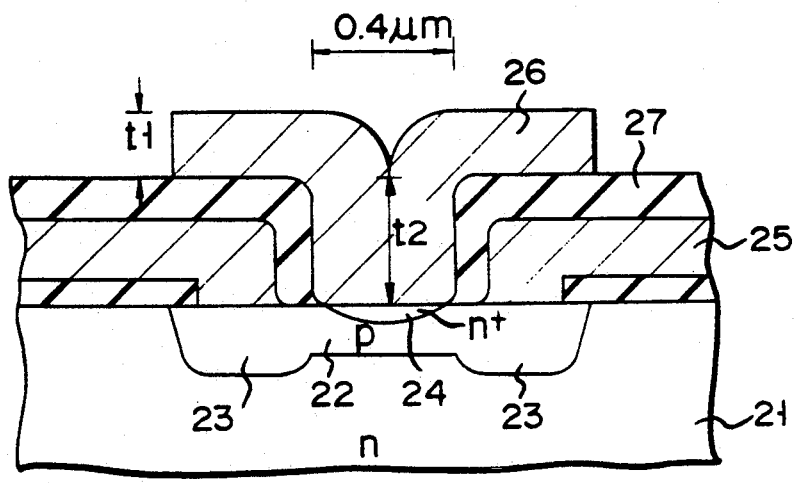
Figure 11C:
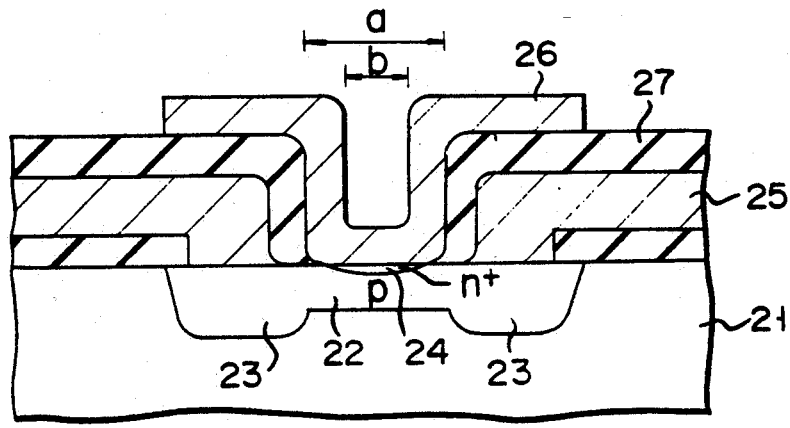
Figure 12A:
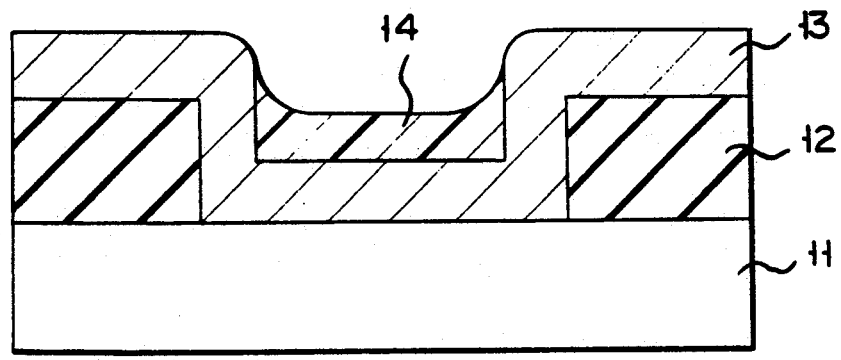
FIGS. 12A and 12B are sectional views for explaining a conventional problem in burying of a polysilicon film.
Figure 12B:
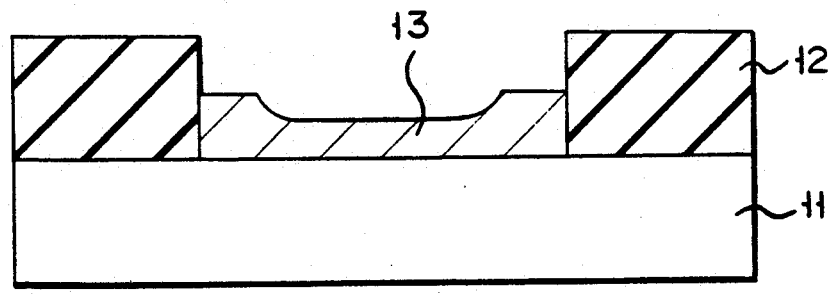

The CVD oxide film 308 on the emitter forming region is selectively removed by photoetching, thereby forming a second opening B for forming an active base region and an emitter region (FIG. 7F). Thermal oxidation is performed using the exposed nitride film 307 as a mask, thus forming an oxide film 313 on the surfaces of the first and second polysilicon films 309 and 311. Thermal oxidation is achieved by wet oxidation at a temperature of 800° to 900° C., and the oxide film 313 having a thickness of 1,000 Å to 3,000 Å is formed on the top surfaces and side surfaces of the polysilicon films. As a result, the contact width between the second polysilicon film 311 and the wafer falls in the range of 2,000 Å to 3,000 Å. In this thermal oxidation step, the boron in the polysilicon film 311 is diffused into the wafer, and a p-type external base layer 312 is formed (FIG. 7G). In this case, in addition to the thermal oxidation step, annealing is performed in an inert gas atmosphere such as an $N_2$ gas to control the diffusion depth and concentration of the p-type external base layer 312, if necessary.

Thereafter, the nitride film 307 in the second opening B is removed by plasma etching, and the underlying oxide film 306 is removed using an NH4F solution, thereby exposing the wafer surface to the second opening B. A thin oxide film having a thickness of about 250 Å is again formed by thermal oxidation on the wafer surface exposed to the second opening B. Boron ions are doped by ion implantation at an acceleration voltage of 15 keV and a dose of $5 \times 10^{13}/cm^2$, thereby forming a p-type active base layer 314.

The oxide film in the second opening B is then removed to expose the wafer surface of the emitter forming region, and arsenic ions are doped therein to form a very shallow arsenic-doped layer. In this case, ion-implantation conditions are an acceleration voltage of 5 to 15 keV and a dose of $5 \times 10^{13}/cm^2$ to $1 \times 10^{16}/cm^2$. Thereafter, a third polysilicon film 316 is deposited as a third conductive material film to cover the second opening B. Arsenic ions are doped by ion implantation in the third polysilicon film 316 at an acceleration voltage of 20 keV and a dose of $1 \times 10^{15}/cm^2$ to $1 \times 10^{16}/cm^2$, and the film 316 is then patterned into a shape required as an emitter electrode. Rapid thermal annealing is performed by halogen lamp radiation at a temperature of 850° to 1,000° C. for several seconds (about 20 sec.) so as to activate the impurity doped in the wafer, thereby forming an $n^+$-type emitter layer 315. At the same time, the impurity doped in the third polysilicon film 316 as the emitter electrode is activated to decrease its resistance. This annealing aims at only activating the impurity and it is important to instantaneously perform the annealing so as not to cause diffusion of the impurity. In this respect, this embodiment is different from the method of forming the emitter region by impurity diffusion from the polysilicon film.

Thereafter, although not shown, base contact holes are formed in the first and second polysilicon films 309 and 311, and Al wiring layers for the emitter, base, and collector are formed to complete the transistor.

According to this embodiment, ion implantation is performed in advance through the second opening when the emitter region is formed. Therefore, the impurity diffusion depth and concentration of the emitter region can be uniform regardless of the size of the opening unlike in a conventional method wherein annealing is performed after an impurity is doped by ion implantation. In this case, annealing for activating an impurity is achieved by utilizing rapid thermal annealing, so that unnecessary impurity diffusion can be prevented, and a very shallow emitter layer can be formed with good controllability.

Solid curves in FIGS. 8 and 9 represent results of measurement of the relationships between an emitter opening width and a current gain HFE, and a cut-off frequency fT. As can be seen from these graphs, according to this embodiment, excellent element characteristics free from decreases in current gain and cut-off frequency up to the emitter opening width of 0.8 μm or less can be obtained. Since a transistor having stable characteristics can be obtained regardless of the size of the emitter opening, stable performance can be obtained when a plurality of transistors having different emitter widths are integrated in a bipolar IC.

According to this embodiment, the external base layer is formed around the CVD oxide film 308 patterned on the emitter region of an element, and the active base layer and the emitter layer are sequentially formed in the region of the CVD oxide film 308. More specifically, these element diffusion layers can be completely self-aligned. In this respect, stable characteristics can be obtained unlike in the conventional transistor. In particular, since the first opening portion for forming the external base layer is formed so as to have a width corresponding to the film thickness of the first polysilicon film 309, it has good controllability, and the width of the external base layer can be easily changed by the film thickness of the first polysilicon film.

In the above embodiment, the emitter region forming step can be modified as follows. The same process is performed until the active base layer is formed. Thereafter, a polysilicon film is deposited and arsenic ions are doped in the polysilicon film simultaneously with film deposition, without performing ion implantation in the wafer. Annealing is then performed to activate the impurity and improve the electrical contact with the wafer, and the polysilicon film is used as the emitter region. In this case, since annealing does not aim at diffusing an impurity into the wafer, rapid thermal annealing is performed so as not to cause diffusion.

A high-performance transistor free from deterioration of characteristics up to an emitter width of 0.8 μm or less can be obtained as in the above embodiment.

In the above embodiment, boron ions are implanted in the second polysilicon film 311, and the external base layer 312 is formed using the second polysilicon film as a doping source. However, such a solid-phase doping source need not always be used. For example, when boron ions are directly doped in the wafer in the state of FIG. 7C, the external base layer can be formed in the annealing step of forming the oxide film 311. This method is preferable since an impurity concentration can be increased and the resistance of the external base layer can be decreased.

Formation of the active base layer in the above embodiment is performed in a state wherein the nitride film 307 and the oxide film 306 are removed by etching and a thin oxide film is again formed. However, after the nitride film 307 or the oxide film is removed, the active base layer can be formed by ion implantation.

The emitter forming step described in the above embodiment can be applied to other self-alignment technologies, e.g., SST. In order to control the distance between the external base region and the emitter region, a method of arranging a spacer formed of another polysilicon film is known. The present invention can be applied to this method.

FIGS. 10A to 10H show steps in the fabrication of a bipolar transistor according to still another embodiment of the present invention. In this embodiment, the embodiment described with reference to FIGS. 7A to 7H is combined with the embodiment described with reference to FIGS. 4A to 5F. Therefore, the same reference numerals in FIGS. 10A to 10H denote the same portions as in FIGS. 7A to 7H, and a detailed description thereof will be omitted. In this embodiment, in FIG. 10B corresponding to FIG. 7B, boron ion implantation is performed to form a carbonized layer 317 in the surface of a buried polysilicon film 310. Other processes are the same as those in the embodiment shown in FIGS. 7A to 7H.

According to this embodiment, since the emitter forming step and the polysilicon film burying step can be improved, a bipolar transistor having a micronized structure for a high-performance IC can be obtained.

What is claimed is:

1. A method of fabricating a bipolar transistor, comprising the steps of:

sequentially depositing a first insulating film and a second insulating film, which is made from a material different from that of said first insulating film and has a greater thickness than that of said first insulating film, on a semiconductor wafer having a collector layer of a first conductivity type;

selectively etching said second insulating film to form a first recess portion on an external base forming region and a base electrode forming region;

depositing a first polysilicon film which serves as a portion of a base electrode on a surface of the wafer, and on a portion thereof which corresponds to said first recess portion so as to form a second recess portion;

burying a photoresist in said second recess portion of said first polysilicon film;

at least partially hardening said photoresist by performing ion implantation to convert at least a surface portion of said photoresist into a hardened layer including a carbonized layer;

selectively etching said first polysilicon film by anisotropic dry etching using said photoresist converted to said carbonized layer as a mask so as to expose said second insulating film;

continuously etching said first polysilicon film, using the exposed second insulating film and said photoresist as a mask, so as to form an opening to which said first insulating film on the external base forming region is exposed;

selectively etching said first insulating film exposed to said opening, using said photoresist and said second insulating film as a mask, so as to expose a wafer surface in the external base forming region;

removing said photoresist and burying a second polysilicon film, serving as the base electrode together with said first polysilicon film, in a region including said opening and surrounded by said second insulating film;

doping an impurity in said second polysilicon film for forming an external base;

removing said second insulating film on an active base forming region by etching, and then performing thermal oxidation so that an oxide film is formed on a surface of said second polysilicon film, and at the same time, diffusing the impurity doped in said second polysilicon film into said collector layer so as to form an external base layer of a second conductivity type;

removing said first insulating film on the active base forming region so as to expose a wafer surface therein and doping an impurity in the exposed wafer surface in the active base forming region to form an active base layer of the second conductivity type; and doping an impurity in a surface of said active base layer to form an emitter layer of the first conductivity type.

2. A method according to claim 1, wherein said first insulating film comprises a CVD silicon nitride film, and said second insulating film comprises a CVD silicon oxide film.

3. A method according to claim 1, wherein the step of forming said active base layer comprises doping an impurity by ion implantation.

4. A method according to claim 1, wherein the step of forming said emitter layer comprises depositing a third polysilicon film; doping an impurity in said third polysilicon film; and performing annealing to diffuse the impurity in said third polysilicon film into the wafer surface.

5. A method of fabricating a bipolar transistor, comprising the steps of:

sequentially depositing a first insulating film and a second insulating film, which is made from a material different from that of said first insulating film and has a greater thickness than that of said first insulating film, on a semiconductor wafer having a collector layer of a first conductivity type;

selectively etching said second insulating film to form a first recess portion on an external base forming region and a base electrode forming region;

depositing a first polysilicon film which serves as a portion of a base electrode on a surface of the wafer, and on a portion thereof which corresponds to said first recess portion so as to form a second recess portion;

burying a photoresist in said second recess portion of said first polysilicon film;

at least partially hardening said photoresist by doping an impurity therein by ion implantation to convert at least a surface portion of said photoresist into a hardened layer including a carbonized layer;

selectively etching said first polysilicon film by anisotropic dry etching using said photoresist converted to said carbonized layer as a mask so as to expose said second insulating film;

continuously etching said first polysilicon film, using the exposed second insulating film and said photoresist as a mask, so as to form an opening to which said first insulating film on the external base forming region is exposed;

selectively etching said first insulating film exposed to said opening, using said photoresist and said second insulating film as a mask, so as to expose a wafer surface in the external base forming region;

doping an impurity in said exposed wafer surface in the external base forming region;

removing said photoresist and burying a second polysilicon film, serving as the base electrode together with said first polysilicon film, in a region including said opening and surrounded by said second insulating film; selectively etching said first insulating film . . . ;

removing said photoresist and burying a second polysilicon film, serving as the base electrode together with said first polysilicon film, in a region including said opening and surrounded by said second insulating film;

removing said second insulating film on an active base forming region by etching, and then performing thermal oxidation so that an oxide film is formed on a surface of said second polysilicon film, and at the same time, diffusing the impurity doped in said wafer into said collector layer so as to form an external base layer of a second conductivity type;

removing said first insulating film on the active base forming region so as to expose a wafer surface therein and doping an impurity in the exposed wafer surface in the active base forming region to form an active base layer of the second conductivity type; and doping an impurity in a surface of said active base layer to form an emitter layer of the first conductivity type.

6. A method according to claim 5, wherein said first insulating film comprises a CVD silicon nitride film, and said second insulating film comprises a CVD silicon oxide film.

7. A method according to claim 5, wherein the step of forming said active base layer comprises doping an impurity by ion implantation.

8. A method according to claim 5, wherein the step of forming said emitter layer comprises depositing a third polysilicon film; doping an impurity in said third polysilicon film; and performing annealing to diffuse the impurity in said third polysilicon film into the wafer surface.

9. A method of fabricating a bipolar transistor, comprising the steps of:

sequentially depositing a first insulating film and a second insulating film, which is made from a material different from that of said first insulating film and has a greater thickness than that of said first insulating layer, on a semiconductor wafer having a collector layer of a first conductivity type;

selectively etching said second insulating film to form a first recess portion on an external base forming region and a base electrode forming region;

depositing a first polysilicon film which serves as a portion of a base electrode on a surface of the wafer, and on a portion thereof which corresponds to said first recess portion so as to form a second recess portion;

burying a photoresist in said second recess portion of said first polysilicon film;

performing doping by ion implantation to convert at least a surface portion of said photoresist into a carbonized layer;

selectively etching said first polysilicon film by anisotropic dry etching using said photoresist converted to said carbonized layer as a mask so as to expose said second insulating film;

etching said first polysilicon film using the exposed second insulating film and said photoresist as a mask so as to form an opening to which said first insulating film on the external base forming region is exposed;

selectively etching said first insulating film exposed to said opening using said photoresist and said second insulating film as a mask so as to expose the wafer surface in the external base forming region;

removing said photoresist and burying a second polysilicon film, serving as the base electrode together with said first polysilicon film, in a region including said opening and surrounded by said second insulating film;

doping an impurity in said second polysilicon film for forming an external base;

removing said second insulating film on an active base forming region by etching, and then performing thermal oxidation so that an oxide film is formed on a surface of said second polysilicon film, and at the same time, diffusing the impurity doped in said second polysilicon film into said collector layer so as to form an external base layer of a second conductivity type;

removing said first insulating film on the active base forming region so as to expose the wafer surface and doping an impurity in the exposed wafer surface in the active base forming region to form an active base layer of the second conductivity type;

shallowly doping an impurity of the first conductivity type in a surface of said active base layer by ion implantation;

depositing a third polysilicon film which contacts the surface of the doped active base layer and serves as an emitter electrode;

doping an impurity of the first conductivity type in said third polysilicon film; and activating the doped impurities in said active base layer and said third polysilicon film by rapid thermal annealing.

10. A method according to claim 9, wherein said first insulating film comprises a CVD silicon nitride film, and said second insulating film comprises a CVD silicon oxide film.

11. A method according to claim 9, wherein the step of forming said active base layer comprises doping an impurity by ion implantation.

12. A method according to claim 9, comprising achieving the rapid thermal annealing by halogen lamp radiation.

* * * * *